United States Patent
Canning

(10) Patent No.: US 7,742,900 B1
(45) Date of Patent: Jun. 22, 2010

(54) COMPRESSION AND COMPRESSED INVERSION OF INTERACTION DATA

(76) Inventor: Francis X. Canning, 3557 Lesser Dr., Newbury Park, CA (US) 91320

( * ) Notice: Subject to any disclaimer, the term of this patent is extended or adjusted under 35 U.S.C. 154(b) by 1114 days.

(21) Appl. No.: 09/676,727

(22) Filed: Sep. 29, 2000

Related U.S. Application Data

(60) Provisional application No. 60/175,454, filed on Jan. 10, 2000, provisional application No. 60/201,149, filed on May 2, 2000.

(51) Int. Cl.
*G06F 17/10* (2006.01)
(52) U.S. Cl. .............................. 703/2; 703/13
(58) Field of Classification Search ............ 703/2, 703/5, 13, 6; 716/3; 345/473
See application file for complete search history.

(56) References Cited

U.S. PATENT DOCUMENTS

| | | | |
|---|---|---|---|
| 5,548,798 | A | 8/1996 | King |
| 5,615,288 | A | 3/1997 | Koshi et al. |
| 5,867,416 | A | 2/1999 | Feldmann et al. |
| 6,051,027 | A | 4/2000 | Kapur et al. |
| 6,064,808 | A * | 5/2000 | Kapur et al. ............... 703/2 |
| 6,182,270 | B1 | 1/2001 | Feldmann et al. |
| 6,353,801 | B1 | 3/2002 | Sercu et al. |
| 6,675,137 | B1 | 1/2004 | Toprac et al. |
| 2004/0010400 | A1 | 1/2004 | Canning |
| 2004/0078174 | A1 | 4/2004 | Canning |
| 2006/0195306 | A1 | 8/2006 | Canning |
| 2006/0265200 | A1 | 11/2006 | Canning |
| 2008/0046225 | A1 | 2/2008 | Canning |
| 2008/0065361 | A1 | 3/2008 | Canning |
| 2008/0091391 | A1 | 4/2008 | Canning |
| 2008/0091392 | A1 | 4/2008 | Canning |
| 2008/0097730 | A1 | 4/2008 | Canning |

OTHER PUBLICATIONS

Francis X. Canning, Kevin Rogovin; "Fast Direct Solution of Standard Moment-Method Matrices", Jun. 1998, IEEE Antenna and Propagation Magazine, vol. 40, No. 3, pp. 15-26.*

Mobile/Cellular Technology website http://www.mobilecomms-technology.com/contractors/antennas/poynting/press2.html, Oct. 2003.*

(Continued)

*Primary Examiner*—Kamini S Shah
*Assistant Examiner*—Herng-Der Day
(74) *Attorney, Agent, or Firm*—Knobbe, Martens, Olson & Bear, LLP

(57) ABSTRACT

A compression technique compresses interaction data. A fast method processes the compressed data without the need to first decompress the data. In one embodiment, the compression technique is used to compress data in an interaction matrix. The interaction matrix (such as a moment method impedance matrix) contains interaction data between sources (e.g., basis functions or expansion functions) and testers (e.g., testing functions). The sources are collected into groups of sources according to specified criteria. One useful criteria is based on grouping sources relatively close to one another. For each group of sources, a composite source is calculated. The testers are also collected into groups and composite testers are calculated. The use of composite sources and composite testers to compute couplings when the source and tester are not close to each other allows the interaction matrix to be computed as a sparse matrix with a block format.

32 Claims, 13 Drawing Sheets

OTHER PUBLICATIONS

D.C. Nitch and A.P.C. Fourie; "A Redesign of NEC2 Using Object-Oriented Paradigm"; 1994; IEEE.*

Massachusetts Institute of Technology; "The Method of Moments in Electromagnetics 6.635 lecture notes".*

Andre Fourie and Derek Nitch; "SuperNEC: Antenna and Indoor-Propagation Simulation Program"; Poynting Software (Pty) Ltd; Jun. 2000.*

D.C. Nitch and A.P.C. Fourie; "Investigating three methods for improving the Performance of the SIM Algorithm"; 1994; IEEE.*

James C. West and J. Michael Sturm; "On Iterative Approaches for Electromagnetic Rough-Surface Scattering Problems"; Aug. 1999; IEEE transactions on Antennas and Propagation, vol. 47, No. 8.*

A.P.C. Fourie and D.C. Nitch; "A fast Sparse Iterative Method (SIM) for Method of Moment"; 1994; IEEE.*

W.C. Chew, J.M. Jin, C.C. Lu, E. Michielssen, J.M. Song; "Fast Solution Methods in Electromagnetics"; Mar. 1997; IEEE transactions on Antennas and Propagation; vol. 45 No. 3 pp. 533-543.*

Francis X. Canning; "A Sparse Approximate Inverse to the IML Matrices Allows Solution in 5 Iterations", 1992, IEEE.*

Massachusetts Institute of Technology, "The Method of Moments in Electromagnetics 6.635 lecture notes", Jan. 2004.*

Shared Kapur, et al., "Efficient Full-Wave Simulation in Layered, Lossy Media," Custom Integrated Circuits Conference, May 11-14, 1998.

Shared Kapur, et al., "IES$^3$ : A Fast Integral Equation Solver for Efficient 3-Dimensional Extraction," International Conference on Computer-Aided Design, Nov. 9-13, 1997.

Shared Kapur, et al., "Efficient Electrostatic and Electromagnetic Simulation Using IES$^3$," IEEE Journal on Comp. Eng., Dec. 1998.

Shared Kapur, et al. "Efficient Three-Dimensional Extraction Based on Static and Full-Wave Layered Green's Functions," Design Automation Conference, Jun. 16, 1998.

Shared Kapur, et al., "High-Order Nyström Schemes for Efficient 3-D Capacitance Extraction," International Conference on Computer-Aided Design, Nov. 8-12, 1998.

Aram K. Kevorkian, et al. "Sparse Complete Orthogonal Factorization as Applied to Bistatic Target Strength Prediction," DOD High Performance Computing 7$^{th}$ Users Group Conference, Jun. 26, 1997.

Eric Michielssen, et al., "Multilevel Evaluation of Electromagnetic Fields for the Rapid Solution of Scattering Problems," Microwave and Optical Technology Letters, vol. 7, No. 17, Dec. 1994, pp. 790-795.

Eric Michielssen, et al., "A Multilevel Matrix Decomposition Algorithm for Analyzing Scattering from Large Structures," IEEE, vol. 44, No. 8, Aug. 1996, pp. 1086-1093.

Eric Michielssen, et al., "Reduced Representation of Matrices Generated by the Method of Moments," IEEE, vol. 1, No. 94CH3466-0, Jun. 1994, pp. 419-423.

Douglas M. Photiadis, "The relationship of singular value decomposition to wave-vector filtering in sound radiation problems," J. Acoust. Soc. Am. 88(2), Aug. 1990, pp. 1152-1159.

Juan M. Rius, et al., "The Multilevel Matrix Decomposition Algorithm in 3-D," Proceedings of the International Conference on Electromagnetics in Advanced Applications, Sep. 1999, pp. 728-732.

Vladimir Rokhlin, "Sparse Diagonal Forms for Translation Operators for Helmholtz Equation in Two Dimensions," Research Report YALEU/DCS/RR-1095, Dec. 1995.

V. Rakhlin, "Diagonal Forms of Translation Operators for the Helmholtz Equation in Three Dimensions," Research Report YALEU/DCS/44-894, Mar. 1992.

Harry A. Schenck, et al., "A hybrid method for predicting the complete scattering function from limited data," J. Acoust. Am. 98(6), Dec. 1995, pp. 3469-3481.

Robert L. Wagner, "A Ray-Propagation Fast Multipole Algorithm," Microwave and Optical Technology Letter, vol. 7, No. 10, Jul. 1994, pp. 435-438.

Anderson, Soren, "On Optimal Dimension Reduction for Sensor Array Signal Processing," Signal Processing, Jan. 1993, 245-256.

Bomholdt, James M., et al, "Mixed-Domain Galerkin Expansions in Scattering Problems," IEEE Transactions on Antennas and Propagation, vol. 36, No. 2, Feb. 1988, 216-227.

Canning, Francis X., "Improved Impedance Matrix Localization Method," IEEE Transactions on Antennas and Propagation, vol. 41, No. 5, May 1993, 659-667.

Herrmann, Gabriel F., "Note on Interpolational Basis Functions in the Method of Moments," IEEE Transactions on Antennas and Propagation, vol. 38, No. 1, Jan. 1990, 134-137.

PCT International Search Report.

Amir Boag, et al., "Complex Multipole Beam Approach to Electromagnetic Scattering Problems," IEEE Transactions on Antennas and Propagation. vol. 42, No. 3, Mar. 1994.

Giorgio V. Borgiotti, et al., "The determination of the far field of an acoustic radiator from sparse measurement samples in the near field," Journal of the Acoustical Society of America, vol. 92, Aug. 1992.

Ovidio M. Bucci, et al., "On the Degrees of Freedom of Scattered Fields," IEEE Transactions on Antennas and Propagation, vol. 37, No. 7, Jul. 1989.

Hai Deng, et al., "Fast Solution of Electromagnetic Integral Equations Using Adaptive Wavelet Packet Transform," IEEE Transactions on Antennas and Propagation, vol. 47, No. 4, Apr. 1999.

G. K. Gothard, et al., "A New Technique to Generate Sparse Matrix Using the Method of Moments—Applications to Two-Dimensional Problems," Presented at the URSI Meeting, Jun. 1995, Newport Beach, California, p. 302 of the meeting digest.

Y.W. Liu, et al., "Scattering of 2-D Conducting Concave Object by MoM Matrix Decomposition Technique," Microwave and Optical Technology Letters, vol. 25, No. 2, Apr. 20, 2000.

Ronald J. Porgorzelski, "Improved Computational Efficiency via Near-Field Localization," IEEE Transactions on Antennas and Propagation, vol. 41, No. 8, Aug. 1993.

Sadasiva M. Rao, et al., "A New Technique to Generate Sparse Matrix Using the Method of Moments—Wire Scattering Problems," Presented at the URSI Meeting, Jun. 1995, Newport Beach, California, p. 303 of the meeting digest.

S.M. Rao, et al., "Generation of Adaptive Basis Functions to Create a Sparse Impedance Matrix Using Method of Moments," Presented at the URSI Meeting, Jul. 20, 2000, Salt Lake City, Utah, p. 354 of the meeting digest.

Sadasiva M. Rao, et al., "A New Technique to Generate a Sparse Matrix Using the Method of Moments for Electromagnetic Scattering Problems," Microwave and Optical Technology Letters, vol. 19, No. 4, Nov. 1998.

Gary P. Zientara, et al., "Dynamic Adaptive MR Imaging Using Multi-Resolution SVD Encoding Incorporating Optical Flow-Based Predictions," Report of National Academy of Sciences Committee on the "Mathematics and Physics of Emerging Dynamic Biomedical Imaging," Nov. 1993.

Vladimir Rokhlin, et al., "Generalized Gaussian Quadratures and Singular Value Decompositions of Integral Operators," Research Report YALEU/DCS/RR-1109, May 1996.

Coifman, Ronald, et al., "The Fast Multipole Method for the Wave Equation: A Pedestrian Prescription," IEEE Antennas and Propagation Magazine, vol. 35, No. 3, Jun. 1993, pp. 7-12.

Kevin Amaratunga, "A wavelet-Based Approach for Compressing Kernal Data in Large-Scale Simulations of 3D Integral Problems," Computing in Science & Engineering, Jul./Aug. 2000, pp. 35-45.

A Brandt, et al., "Multilevel Matrix Multiplication and Fast Solution of Integral Equations," Journal of Computational Physics, 1990, pp. 346-370.

Francis X. Canning, "The Impedance Matrix Localization (IML) Method for Moment-Method Calculations," IEEE Antennas and Propagation Magazine, vol. 23, No. 5, Oct. 1990. pp. 18-30.

Francis X. Canning, "Reducing Moment Method Storage from Order $N^2$ to Order N," Electronics Letters, vol. 25. No. 19, Sep. 1989, pp. 1274-1275.

Francis X. Canning, "Solution of impedance matrix localization form of moment method problems in five iterations," Radio Science, vol. 30, No. 5, Sep.-Oct. 1995, pp. 1371-1384.

Francis X. Canning, "Fast Sparse Decomposition of Standard Moment Method Matrices." 1997 North American Radio Science Meeting, Program and Abstracts, Jul. 1997. pp. 68-69.

Francis X. Canning, "Fast Direct Solution of Standard Moment-Method Matrices," IEEE Antennas & Propagation, vol. 40, No. 3, Jun. 1998. pp. 15-26.

Francis X. Canning, "A Fast Moment Method Matrix Solver." 14th Annual Review of Progress in Applied Computational Electromagnetics, Mar. 1998, pp. 449-454.

L. Greengard, et al., "A Fast Algorithm for Particle Simulations," Journal of Computational Physics, vol. 73, No. 2, Dec. 1987, pp. 325-348.

"SuperNEC: GUI Input User Reference Manual," Version 1.5, Poynting Software (Pty) Ltd., May 11, 2001, in 108 pages.

"SuperNEC: GUI Output User Reference Manual," Version 2.0, Poynting Software (Pty) Ltd., Dec. 3, 2001, in 49 pages.

"SuperNEC: Getting Started," Version 1.53, Poynting Software (Pty) Ltd., Sep. 3, 2001, in 27 pages.

"SuperNEC: GUI User Reference Manual," Version 1.00, Poynting Software (Pty) Ltd., Jul. 12, 2000, in 43 pages.

"SuperNEC: MOM Technical Reference Manual," Version 1.00, Poynting Software (Pty) Ltd., Jul. 14, 2000, in 63 pages.

"SuperNEC: MOM-UTD Hybrid User Reference Manual," Version 1.00, Poynting Software (Pty) Ltd., Jul. 14, 2000, in 68 pages.

"SuperNEC: Parallel MoM User Reference Manual," Version 2.0, Poynting Software (Pty) Ltd., Oct. 20, 2004, in 12 pages.

"SuperNEC: Parallel MoM User Reference Manual," Version 1.00, Poynting Software (Pty) Ltd., Sep. 21, 1999, 13 pages.

Keith Nabors and Jacob White, "FastCap: A Multipole Accelerated 3-D Capacitance Extraction Program," IEEE Transactions on Computer Aided Design, vol. 10, No. 11, Nov. 1991, pp. 1447-1459.

Hackbusch, Leipzig W., "A Sparse Matrix Arithmetic Based on H-Matrices. Part I: Introduction to H-Matrices," Computing 62, pp. 89-108, 1999.

Baharav, Zachi, "Impedance Matrix Compression (IMC) Using Iteratively Selected Wavelet Basis," IEEE Transactions on Antennas and Propagation, vol. 46, No. 2, Feb. 2, 1998, pp. 226-233.

Bank, Randolph E., "Marching Algorithms and Block Gaussian Elimination," Sparse Matrix Computations, 1976, pp. 293-307.

Bunch, James R., "Block Methods for Solving Sparse Linear Systems," Sparse Matrix Computations, 1976, pp. 39-58.

Bunch, James R., "Partitioning, Tearing and Modification of Sparse Linear Systems," Journal of Mathematical Analysis and Applications 48, 1974, pp. 574-593.

Canning, Francis X., "Impedance Matrix Localization Produces a Sparse Moment Method Matrix," IEEE Antennas and Propagation Society International Symposium, 1990. AP-S. 'Merging Technologies for the 90's.' Digest, May 1990, pp. 60-63.

Coifman et al., "Faster Single-Stage Multipole Method for the Wave Equation," Conference Proceedings; 10th Annual Review of Progress in Applied Computational Electromagnetics; at the Doubletree Hotel & Convention Center, Monterey, CA, vol. 1, Mar. 21-26, 1994, pp. 19-24.

Conroy et al., "Data-Parallel Sparse LU Factorization," Siam J. Sci. Comput., vol. 19, No. 2, Mar. 1998, pp. 584-604.

George, Alan, "On Block Elimination for Sparse Linear Systems," Siam J. Numer Anal, vol. 11, No. 3, Jun. 1974, pp. 585-603.

Higham, Nicholas J., "Block LU Factorization," Accuracy and Stability of Numerical Algorithms, Siam, 1996, pp. 245-259.

Nabors et al., "FastCap: A Multipole Accelerated 3-D Capacitance Extraction Program," IEEE Transactions on Computer Aided Design, vol. 10, No. 11, Nov. 1991, pp. 1447-1459.

Saad et al., "Bilutm: A Domain-Based Multilevel Block Ilut Preconditioner for General Sparse Matrices," Siam J. Matrix Anal. Appl., vol. 21, No. 1, 1999, pp. 279-299.

Yalamov et al., "On the Stability of a Partitioning Algorithm for Tridiagonal Systems," Siam J. Matrix Anal. Appl., vol. 20, No. 1, 1998, pp. 159-181.

Kastner et al., "Multi-Region Reduced Field Testing (RFT) for Matrix Thinning," Third International Conference on Computation in Electromagnetics, Apr. 1996, pp. 312-317.

Bebendorf, Mario, "Approximation of Boundary Element Matrices," Jun. 8, 2000.

* cited by examiner

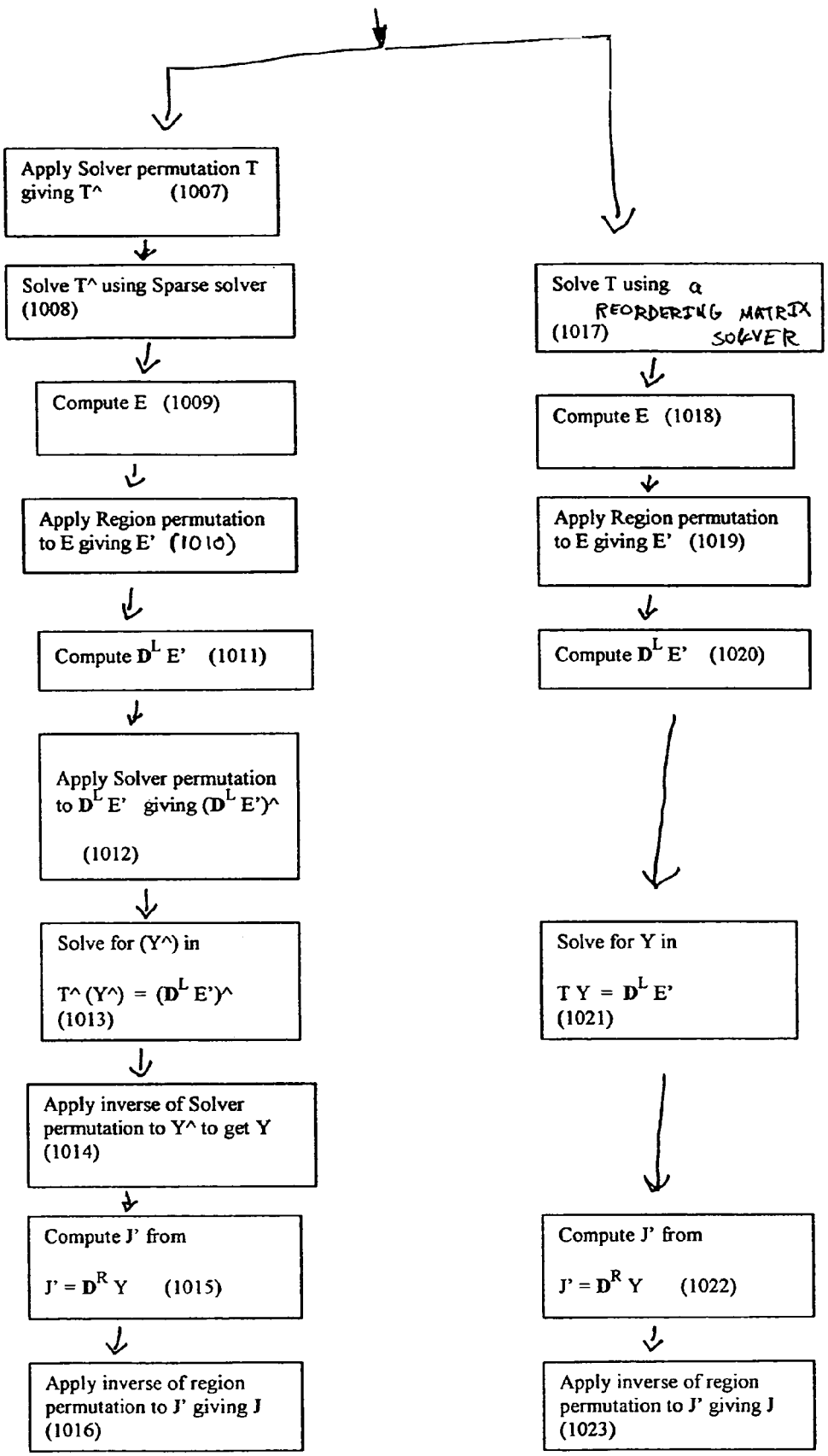

COMPRESSION AND COMPRESSED INVERSION OF INTERACTION DATA

RELATED APPLICATIONS

The present application claims priority under 35 U.S.C. 119(e) from U.S. Provisional Application No. 60/175,454, filed on Jan. 10, 2000, titled "COMPRESSION AND COMPRESSED INVERSION OF INTERACTION DATA" and from U.S. Provisional Application No. 60/201,149, filed on May 2, 2000, titled "COMPRESSION AND COMPRESSED INVERSION OF INTERACTION DATA," the contents of which are hereby incorporated by reference in their entirety.

BACKGROUND OF THE INVENTION

1. Field of the Invention

The invention relates to methods for compressing the stored data, and methods for manipulating the compressed data, in numerical solutions involving numerous mutual interactions, especially when the nature of these interactions approaches an asymptotic form for large distances, such as, for example, antenna problems solved using the method of moments.

2. Description of the Related Art

Many numerical techniques are based on a "divide and conquer" strategy wherein a complex structure or a complex problem is broken up into a number of smaller, more easily solved problems. Such strategies are particularly useful for solving integral equation problems involving radiation, heat transfer, scattering, mechanical stress, vibration, and the like. In a typical solution, a larger structure is broken up into a number of smaller structures, called elements, and the coupling or interaction between each element and every other element is calculated. For example, if a structure is broken up into 16 elements, then the inter-element mutual interaction (or coupling) between each element and every other element can be expressed as a 16 by 16 interaction matrix.

As computers become more powerful, such element-based numerical techniques are becoming increasingly important. However, when it is necessary to simultaneously keep track of many, or all, mutual interactions, the number of such interactions grows very quickly. The size of the interaction matrix often becomes so large that data compression schemes are desirable or even essential. Also, the number of computer operations necessary to process the data stored in the interaction matrix can become excessive. The speed of the compression scheme is also important, especially if the data in the interaction matrix has to be decompressed before it can be used.

Typically, especially with radiation-type problems involving sound, vibration, stress, temperature, electromagnetic radiation, and the like, elements that are physically close to one another produce strong interactions. Elements that are relatively far apart (usually where distance is expressed in terms of a size, wavelength, or other similar metric) will usually couple less strongly. For example, when describing the sound emanating from a loudspeaker, the sound will change in character relatively quickly in the vicinity of that speaker. If a person standing very near the speaker moves one foot closer, the sound may get noticeably louder. However, if that person is sitting at the other end of a room, and moves one foot closer, then the change in volume of the sound will be relatively small. This is an example of a general property of many physical systems. Often, in describing the interaction of two nearby objects, relatively more detail is needed for an accurate description, while relatively less detail is needed when the objects are further apart.

As another example, consider a speaker producing sound inside a room. To determine the sound intensity throughout that room, one can calculate the movement (vibration) of the walls and objects in the room. Typically such calculation will involve choosing a large number of evenly spaced locations in the room, and determining how each location vibrates. The vibration at any one location will be a source of sound, which will typically react with every other location in the room. The number of such interactions would be very large and the associated storage needed to describe such interactions can become prohibitively large. Moreover, the computational effort needed to solve the matrix of interactions can become prohibitive.

SUMMARY OF THE INVENTION

The present invention solves these and other problems by providing a compression scheme for interaction data and an efficient method for processing the compressed data without the need to first decompress the data. In other words, the data can be numerically manipulated in its compressed state.

Given a first region containing sources relatively near to each other, and a second region containing sources relatively near to each other, but removed from the first region; one embodiment provides a simplified description of the possible interactions between these two regions. That is, the first region can contain a relatively large number of sources and a relatively large amount of data to describe mutual interactions between sources within the first region. In one embodiment, a reduced amount of information about the sources in the first region is sufficient to describe how the first region interacts with the second region. One embodiment includes a way to find these reduced interactions with relatively less computational effort than in the prior art.

For example, one embodiment includes a first region of sources in one part of a problem space, and a second region of sources in a portion of the problem space that is removed from the first region. Original sources in the first region are modeled as composite sources (with relatively fewer composite sources than original sources). In one embodiment, the composite sources are described by linear combinations of the original sources. The composite sources are reacted with composite testers to compute interactions between the composite sources and composite testers in the two regions. The use of composite sources and composite testers allows reactions in the room (between regions that are removed from each other) to be described using fewer matrix elements than if the reactions were described using the original sources and testers. While an interaction matrix based on the original sources and testers is typically not a sparse matrix, the interaction matrix based on the composite sources and testers is typically a sparse matrix having a block structure.

One embodiment is compatible with computer programs that store large arrays of mutual interaction data. This is useful since it can be readily used in connection with existing computer programs. In one embodiment, the reduced features found for a first interaction group are sufficient to calculate interactions with a second interaction group or with several interaction groups. In one embodiment, the reduced features for the first group are sufficient for use in evaluating interactions with other interaction groups some distance away from the first group. This permits the processing of interaction data more quickly even while the data remains in a compressed format. The ability to perform numerical operations using compressed data allows fast processing of data using multi-level and recursive methods, as well as using single-level methods.

DESCRIPTION OF THE FIGURES

The advantages and features of the disclosed invention will readily be appreciated by persons skilled in the art from the following detailed description when read in conjunction with the drawings listed below.

Figure 1A:
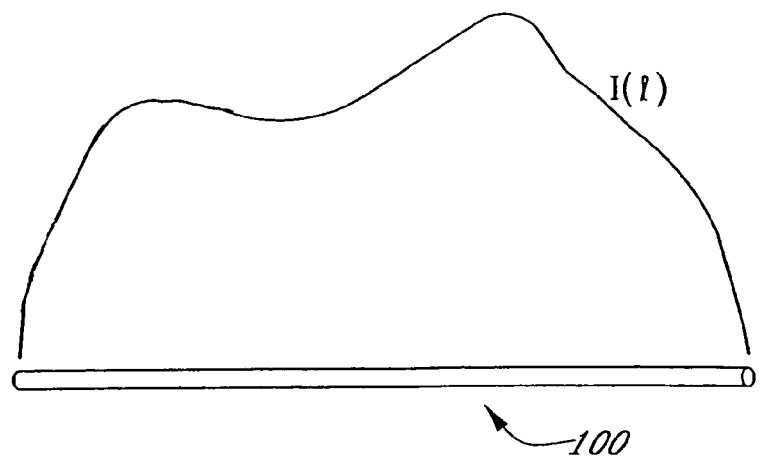
FIG. 1A illustrates a wire or rod having a physical property (e.g., a current, a temperature, a vibration, stress, etc.) $I(\ell)$ along its length, where the shape of $I(\ell)$ is unknown.

In the drawings, the first digit of any three-digit number generally indicates the number of the figure in which the element first appears. Where four-digit reference numbers are used, the first two digits indicate the figure number.

DETAILED DESCRIPTION

Many physical phenomena involve sources that generate a disturbance, such as an electromagnetic field, electromagnetic wave, a sound wave, vibration, a static field (e.g., electrostatic field, magnetostatic field, gravity field, etc) and the like. Examples of sources include a moving object (such as a loudspeaker that excites sound waves in air) and an electrical current (that excites electric and magnetic fields), etc. For example, the electric currents moving on an antenna produce electromagnetic waves. Many sources produce disturbances both near the source and at a distance from the source.

Sometimes it is convenient to consider disturbances as being created by an equivalent source (e.g., a fictitious source) rather than a real physical source. For example, in most regions of space (a volume of matter for example) there are a large number of positive electric charges and a large number of negative electric charges. These positive and negative charges nearly exactly cancel each other out. It is customary to perform calculations using a fictitious charge, which is the net difference between the positive and negative charge, averaged over the region of space. This fictitious charge usually cannot be identified with any specific positive or negative particle.

A magnetic current is another example of a fictitious source that is often used. It is generally assumed that magnetic monopoles and magnetic currents do not exist (while electric monopoles and electric currents do exist). Nevertheless, it is known how to mathematically relate electric currents to equivalent magnetic currents to produce the same electromagnetic waves. The use of magnetic sources is widely accepted, and has proven very useful for certain types of calculations. Sometimes, it is convenient to use a source that is a particular combination of electric and magnetic sources. A distribution of sources over some region of space can also be used as a source. The terms "sources" and "physical sources" are used herein to include all types of actual and/or fictitious sources.

A physical source at one location typically produces a disturbance that propagates to a sensor (or tester) at another location. Mathematically, the interaction between a source and a tester is often expressed as a coupling coefficient (usually as a complex number having a real part and an imaginary part). The coupling coefficients between a number of sources and a number of testers is usually expressed as an array (or matrix) of complex numbers. Embodiments of this invention includes efficient methods for the computation of these complex numbers for the storing of these complex numbers, and for computations using these complex numbers.

The so-called Method of Moments (MoM) is an example of numerical analysis procedure that uses interactions between source functions and testing functions to numerically solve a problem that involves finding an unknown function (that is, where the solution requires the determination of a function of one or more variables). The MoM is used herein by way of example and not as a limitation. One skilled in the art will recognize that the MoM is one of many types of numerical techniques used to solve problems, such as differential equations and integral equations, where one of the unknowns is a function. The MoM is an example of a class of solution techniques wherein a more difficult or unsolvable problem is broken up into one or more interrelated but simpler problems. Another example of this class of solution techniques is Nystrom's method. The simpler problems are solved, in view of the known interrelations between the simpler problems, and the solutions are combined to produce an approximate solution to the original, more difficult, problem.

For example, FIG. 1A shows a wire or rod 100 having a physical property (e.g., a current, a temperature, a stress, a voltage, a vibration, a displacement, etc.) along its length. An expression for the physical property is shown as an unknown function $I(\ell)$. The problem is to calculate $I(\ell)$ using the MoM or a similar "divide and conquer" type of technique. By way of example, in many physical problems involving temperature, vibration, or electrical properties, etc. $I(\ell)$ will be described by an integral equation of the form:

$$E(\overline{R}) = \int I(\ell) G(\ell, \overline{R}) d\ell$$

Where $G(\ell, \overline{R})$ is known everywhere and $E(\overline{R})$ is known for certain values of $\overline{R}$. In many circumstances, $G(\ell, \overline{R})$ is a Green's function, based on the underlying physics of the problem, and the value of $E(\overline{R})$ is known only at boundaries (because of known boundary conditions). The above equation is usually not easily solved because $I(\ell)$ is not known, and thus the integration cannot be performed. The above integral equation can be turned into a differential equation (by taking the derivative of both sides), but that will not directly provide a solution. Regardless of whether the above equation is expressed as an integral equation or a differential equation, the equation can be numerically solved for $I(\ell)$ by creating a set of simpler but interrelated problems as described below (provided that $G(\ell,\overline{R})$ possesses certain mathematical properties known to those of skill in the art).

Figure 1B:
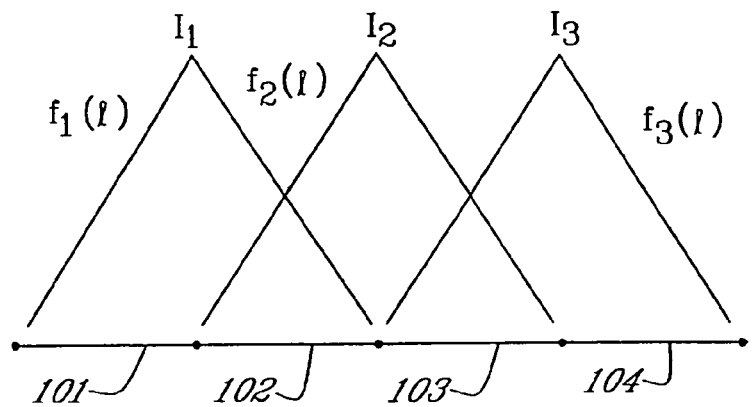
FIG. 1B illustrates the wire from FIG. 1A, broken up into four segments, where the function $I(\ell)$ has been approximated by three known basis functions $f_i(\ell)$, and where each basis function is multiplied by an unknown constant $I_i$.

As shown in FIG. 1B, in order to compute a numerical approximation for $I(\ell)$, the wire 100 is first divided up into four segments 101-104, and basis function $f_1(\ell)$, $f_2(\ell)$, and $f_3(\ell)$ are selected. In FIG. 1B the basis functions are shown as triangular-shaped functions that extend over pairs of segments. The unknown function $I(\ell)$ can then be approximated as:

$$I(\ell) \approx I_1 f_1(\ell) + I_2 f_2(\ell) + I_3 f_3(\ell)$$

where $I_1$, $I_2$, and $I_3$ are unknown complex constants. Approximating $I(\ell)$ in this manner transforms the original problem from one of finding an unknown function, to a problem of finding three unknown constants. The above approximation for $I(\ell)$ is inserted into the original integral equation above to yield:

$$E(\overline{R}) = \int I_1 f_1(\ell) G(\ell,\overline{R}) d\ell + \int I_2 f_2(\ell) G(\ell,\overline{R}) d\ell + \int I_3 f_3(\ell) G(\ell,\overline{R}) d\ell$$

The above integrals can now be performed because the functional form of the integrands are all known ($G(\ell,\overline{R})$ was determined by the problem being solved, the functions $f_i(\ell)$ were selected, and the constants $I_1$, $I_2$ and $I_3$ can be moved outside the integrals). However, this does not yet solve the problem because the values of $I_1$, $I_2$ and $I_3$ are still unknown.

Fortunately, as indicated above, the value of $E(\overline{R})$ is usually known at various specific locations (e.g., at boundaries). Thus, three equations can be written by selecting three locations $\overline{R}_1$, $\overline{R}_2$, $\overline{R}_3$, where the value of $E(\overline{R})$ is known. Using these three selected locations, the above equation can be written three times as follows:

$$E(\overline{R}_1) = I_1 \int f_1(\ell) G(\ell,\overline{R}_1) d\ell + I_2 \int f_2(\ell) G(\ell,\overline{R}_1) d\ell + I_3 \int f_3(\ell) G(\ell,\overline{R}_1) d\ell$$

$$E(\overline{R}_2) = I_1 \int f_1(\ell) G(\ell,\overline{R}_2) d\ell + I_2 \int f_2(\ell) G(\ell,\overline{R}_2) d\ell + I_3 \int f_3(\ell) G(\ell,\overline{R}_2) d\ell$$

$$E(\overline{R}_3) = I_1 \int f_1(\ell) G(\ell,\overline{R}_3) d\ell + I_2 \int f_2(\ell) G(\ell,\overline{R}_3) d\ell + I_3 \int f_3(\ell) G(\ell,\overline{R}_3) d\ell$$

Rather than selecting three specific locations for $E(\overline{R})$, it is known that the accuracy of the solution is often improved by integrating known values of $E(\overline{R})$ using a weighting function over the region of integration. For example, assuming that $E(\overline{R})$ is known along the surface of the wire 100, then choosing three weighting functions $g_1(\ell)$, $g_2(\ell)$, and $g_3(\ell)$, the desired three equations in three unknowns can be written as follows (by multiplying both sides of the equation by $g_i(\ell)$ and integrating:

$$\int E(\ell') g_1(\ell') d\ell' = I_1 \iint f_1(\ell) g_1(\ell') G(\ell,\ell') d\ell d\ell' + I_2 \iint f_2(\ell) g_1(\ell') G(\ell,\ell') d\ell d\ell' + I_3 \iint f_3(\ell) g_1(\ell') G(\ell,\ell') d\ell d\ell'$$

$$\int E(\ell') g_2(\ell') d\ell' = I_1 \iint f_1(\ell) g_2(\ell') G(\ell,\ell') d\ell d\ell' + I_2 \iint f_2(\ell) g_2(\ell') G(\ell,\ell') d\ell d\ell' + I_3 \iint f_3(\ell) g_2(\ell') G(\ell,\ell') d\ell d\ell'$$

$$\int E(\ell') g_3(\ell') d\ell' = I_1 \iint f_1(\ell) g_3(\ell') G(\ell,\ell') d\ell d\ell' + I_2 \iint f_2(\ell) g_3(\ell') G(\ell,\ell') d\ell d\ell' + I_3 \iint f_3(\ell) g_3(\ell') G(\ell,\ell') d\ell d\ell'$$

Note that the above double-integral equations reduce to the single-integral forms if the weighting functions $g_1(\ell)$ are replaced with delta functions.

The three equations in three unknowns can be expressed in matrix form as:

$$V = ZI$$

or $$\begin{bmatrix} V_1 \\ V_2 \\ V_3 \end{bmatrix} = \begin{bmatrix} Z_{11} & Z_{12} & Z_{13} \\ Z_{21} & Z_{22} & Z_{23} \\ Z_{31} & Z_{32} & Z_{33} \end{bmatrix} \begin{bmatrix} I_1 \\ I_2 \\ I_3 \end{bmatrix}$$

where $$V_i = \int E(\ell') g_i(\ell') d\ell'$$

and $$Z_{ij} = \iint f_j(\ell) g_i(\ell') G(\ell,\ell') d\ell d\ell'$$

Figure 1C:
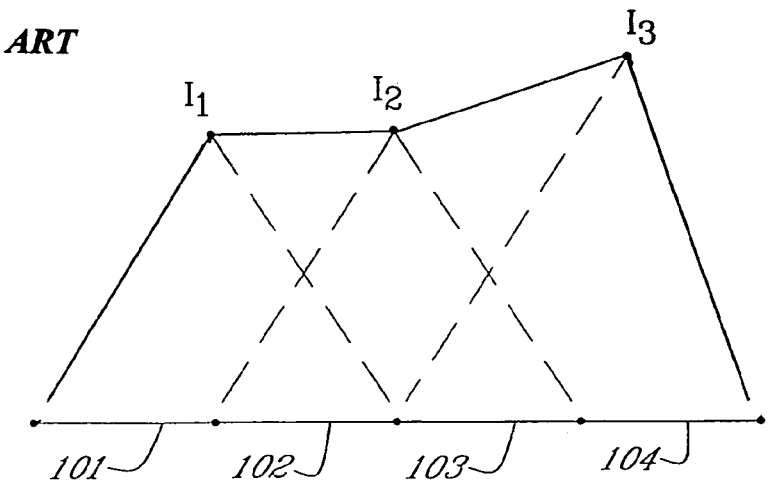
FIG. 1C illustrates a piecewise linear approximation to the function $I(\ell)$ after the constants $I_i$ have been determined.

Solving the matrix equation yields the values of $I_1$, $I_2$, and $I_3$. The values $I_1$, $I_2$, and $I_3$ can then be inserted into the equation $I(\ell) \approx I_1 f_1(\ell) + I_2 f_2(\ell) + I_3 f_3(\ell)$ to given an approximation for $I(\ell)$. If the basis functions are triangular functions as shown in FIG. 1B, then the resulting approximation for $I(\ell)$ is a piecewise linear approximation as shown in FIG. 1C. The $I_i$ are the unknowns and the $V_i$ are the conditions (typically, the $V_i$ are knowns). Often there are the same number of conditions as unknowns. In other cases, there are more conditions than unknowns or less conditions than unknown.

The accuracy of the solution is largely determined by the shape of the basis functions, by the shape of the weighting functions, and by the number of unknowns (the number of unknowns usually corresponds to the number of basis functions).

Unlike the Moment Method described above, some techniques do not use explicit basis functions, but, rather, use implicit basis functions or basis-like functions. For example, Nystrom's method produces a numerical value for an integral using values of the integrand at discrete points and a quadrature rule. Although Nystrom's method does not explicitly use an expansion in terms of explicit basis functions, nevertheless, in a physical sense, basis functions are still being used (even if the use is implicit). That is, the excitation of one unknown produces some reaction throughout space. Even if the computational method does not explicitly use a basis function, there is some physical excitation that produces approximately the same reactions. All of these techniques are similar, and one skilled in the art will recognize that such techniques can be used with the present invention. Accordingly, the term "basis function" will be used herein to include such implicitly used basis functions. Similarly, the testers may be implicitly used.

When solving most physical problems (e.g., current, voltage, temperature, vibration, force, etc), the basis functions tend to be mathematical descriptions of the source of some physical disturbance. Thus, the term "source" is often used to refer to a basis function. Similarly, in physical problems, the weighting functions are often associated with a receiver or sensor of the disturbance, and, thus, the term "tester" is often used to refer to the weighting functions.

As described above in connection with FIGS. 1A-1C, in numerical solutions, it is often convenient to partition a physical structure or a volume of space into a number of smaller pieces and associate the pieces with one or more sources and testers. In one embodiment, it is also convenient to partition the structure of (or volume) into regions, where each region contains a group of the smaller pieces. Within a given region, some number of sources is chosen to describe with sufficient detail local interactions between sources and testers within that region. A similar or somewhat smaller number of sources in a given region is generally sufficient to describe interactions between sources in the source region and testers in the regions relatively close by. When the appropriate sources are used, an even smaller number of sources is often sufficient to describe interactions between the source region and testers in regions that are not relatively close by (i.e., regions that are relatively far from the source region).

Embodiments of the present invention include methods and techniques for finding composite sources. Composite sources are used in place of the original sources in a region such that a reduced number of composite sources is needed to calculate the interactions with a desired accuracy.

In one embodiment, the composite sources for a first region are the same regardless of whether the composite sources in the first region are interacting with a second region, a third region, or other regions. The use of the same composite sources throughout leads to efficient methods for factoring and solving the interaction matrix.

Considering the sources in the first region, one type of source is the so-called multipole, as used in a multipole expansion. Sources like wavelets are also useful. In some cases wavelets allow a reduced number of composite sources to be used to describe interactions with distant regions. However, there are disadvantages to wavelet and multipole approaches. Wavelets are often difficult to use, and their use often requires extensive modifications to existing or proposed computer programs. Wavelets are difficult to implement on non-smooth and non-planar bodies.

Multipole expansions have stability problems for slender regions. Also, while a multipole expansion can be used for describing interactions with remote regions, there are severe problems with using multipoles for describing interactions within a region or between spatially close regions. This makes a factorization of the interaction matrix difficult. It can be very difficult to determine how to translate information in an interaction matrix into a wavelet or multipole representation.

Figure 2:
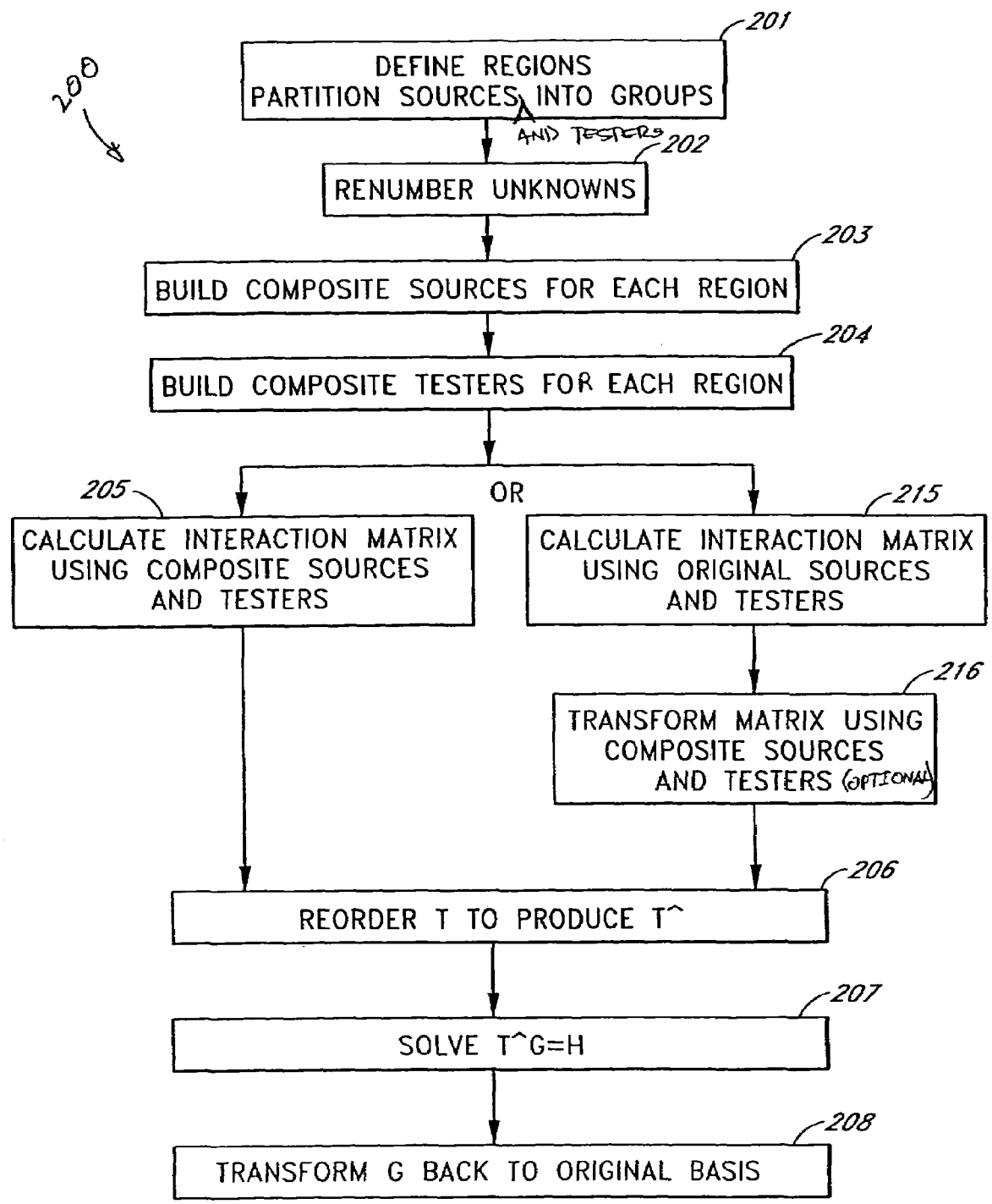
FIG. 2 is a flowchart showing the process steps used to generate a compressed (block sparse) interaction matrix.

FIG. 2 is a flowchart that illustrates a compression technique 200 for compressing an interaction matrix by combining groups of sources and groups of testers into composite sources and testers. The use of composite sources and composite testers allows the original interaction matrix to be transformed into a block sparse matrix having certain desirable properties.

Embodiments of the present invention include a technique for computing and using composite sources to provide compression of an interaction matrix by transforming the interaction matrix into a block sparse matrix. The present technique is compatible with existing and proposed computer programs. It works well even for rough surfaces and irregular grids of locations. For a given region, the composite sources allow computation of a disturbance (e.g., radiation) produced by the source throughout a desired volume of space. A reduced number of these composite sources is sufficient to calculate (with a desired accuracy) disturbances at other relatively distant regions. This method of compressing interaction data can be used with a variety of computational methods, such as, for example, an LU (Lower Triangular Upper triangular) factorization of a matrix or as a preconditioned conjugate gradient iteration. In many cases, the computations can be done while using the compressed storage format.

FIG. 2 is a flowchart 200 illustrating the steps of solving a numerical problem using composite sources. The flowchart 200 begins in a step 201 where a number of original sources and original testers are collected into groups, each group corresponding to a region. Each element of the interaction matrix describes an interaction (a coupling) between a source and a tester. The source and tester are usually defined, in part, by their locations in space. The sources and testers are grouped according to their locations in space. In one embodiment, the number of regions of space are defined. A reference point is chosen for each region. Typically the reference point will lie near the center of the region. The sources and testers are grouped into the regions by comparing the location of the source or tester to the reference point for each region. Each source or tester is considered to be in the region associated with the reference point closest to the location. (For convenience, the term "location" is used hereinafter to refer to the location of a source or a tester.)

Other methods for grouping the sources and testers (that is, associating locations with regions) can also be used. The process of defining the regions is problem-dependent, and in some cases the problem itself will suggest a suitable set of regions. For example, if the sources and testers are located on the surface of a sphere, then curvilinear-square regions are suggested. If the sources and testers are located in a volume of space, then cubic regions are often useful. If the sources and testers are located on a complex three-dimensional surface, then triangular patch-type regions are often useful.

Figure 3:
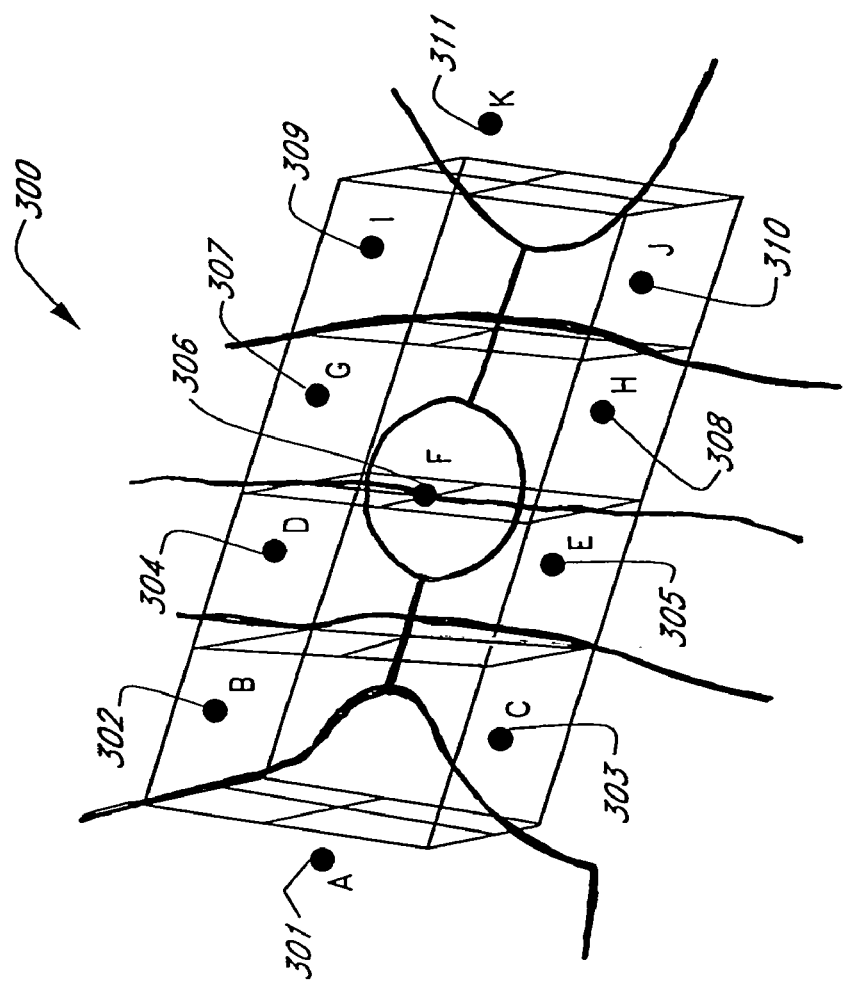
FIG. 3 illustrates partitioning a body into regions.

Generally the way in which the regions are defined is not critical, and the process used to define the regions will be based largely on convenience. However, it is usually preferable to define the regions such that the locations of any region are relatively close to each other, and such that there are relatively few locations from other regions close to a given region. In other words, efficiency of the compression algorithm is generally improved if the regions are as isolated from one another as reasonably possible. Of course, adjacent regions are often unavoidable, and when regions are adjacent to one another, locations near the edge of one region will also be close to some locations in an adjacent region. Nevertheless, the compression will generally be improved if, to the extent reasonably possible, regions are defined such that they are not slender, intertwining, or adjacent to one another. For example, FIG. 3 illustrates a volume of space partitioned into a rectangular box 300 having eleven regions A through K corresponding to reference points 301-311.

As shown in FIG. 2, after the step 201 the process advances to a step 202. In the step 202, the unknowns are renumbered, either explicitly or implicitly, so that locations within the same region are numbered consecutively. It is simpler to continue this description as if the renumbering has actually been done explicitly. However, the following analysis can also be performed without explicit renumbering.

The term "spherical angles" is used herein to denote these angles. One skilled in the art will recognize that if a two-dimensional problem is being solved, then the spherical angles reduces to a planar angle. Similarly, one skilled in the art will recognize that if a higher-dimensional problem is being solved (such as, for example, a four dimensional space having three dimensions for position and one dimension for time) then the term spherical angle denotes the generalization of the three-dimensional angle into four-dimensional space. Thus, in general, the term spherical angle is used herein to denote the notion of a "space-filling" angle for the physical problem being solved.

After renumbering, the process advances to a block 203 wherein one or more composite sources for each region are determined. If there are p independent sources within a region, then q composite sources can be constructed (where $q \leq p$). The construction of composite sources begins by determining a relatively dense set of far-field patterns (usually described in a spherical coordinate system) at relatively large distances from the region. As used herein, far-field refers to the field in a region where the field can be approximated in terms of an asymptotic behavior. For example, in one embodiment, the far-field of an antenna or other electromagnetic radiator includes the field at some distance from the antenna, where the distance is relatively larger than the electrical size of the antenna.

A far-field pattern is constructed for each independent source. In the present context, dense means to avoid having any overly-large gaps in the spherical angles used to calculate the set of disturbances. Dense also means that if the disturbance is represented by a vector, then each vector component is represented. For example, for a scalar problem, one might choose p spherical angles. These angles are typically substantially equally spaced, and the ranges of angles include the interaction angles occurring in the original interaction matrix (if all of the interactions described in the original matrix lie within a plane, then one can choose directions only within that plane rather than over a complete sphere).

The far-field data is stored in a matrix s having p columns (one column for each source location within the region), and rows associated with angles. While each source is logically associated with a location in a given region, these sources are not necessarily located entirely within that region. While each source corresponds to a location (and each location is assigned to a region), sources that have a physical extent can extend over more than one region. The entries in the matrix s can be, for example, the field quantity or quantities that emanate from each source. It is desirable that the field quantity is chosen such that when it (or they) are zero at some angle then, to a desired approximation, all radiated quantities are zero at that angle. While it is typically desirable that the angles be relatively equally spaced, large deviations from equal spacing can be acceptable.

These composite sources are in the nature of equivalent sources. A smaller number of composite sources, compared to the number of sources they replace, can produce similar disturbances for regions of space removed from the region occupied by these sources.

As described above, sources are collected into groups of sources, each group being associated with a region. For each group of sources, a group of composite sources is calculated. The composite source is in the nature of an equivalent source that, in regions of space removed from the region occupied by the group in replaces, produces a far-field (disturbance) similar to the field produced by the group it replaces. Thus, a composite source (or combination of composite sources) efficiently produces the same approximate effects as the group of original sources at desired spherical angles and at a relatively large distance. To achieve a relatively large distance, is it often useful to use a limiting form as the disturbance goes relatively far from its source.

Each composite source is typically a linear combination of one or more of the original sources. A matrix method is used to find composite sources that broadcast strongly and to find composite sources that broadcast weakly. These composite sources are constructed from the original sources. The matrix method used to find composite sources can be a rank-revealing factorization such as singular value decomposition. For a singular value decomposition, the unitary transformation associated with the sources gives the composite sources as a linear combination of sources.

Variations of the above are possible. For example, one can apply the singular value decomposition to the transpose of the s matrix. One can employ a Lanczos Bi-diagonalization, or related matrix methods, rather than a singular value decomposition. There are other known methods for computing a low rank approximation to a matrix. Some examples of the use of Lanczos Bidiagonalization are given in Francis Canning and Kevin Rogovin, "Fast Direct Solution of Standard Moment-Method Matrices," IEEE AP Magazine, Vol. 40, No. 3, June 1998, pp. 15-26.

There are many known methods for computing a reduced rank approximation to a matrix. A reduced rank approximation to a matrix is also a matrix. A reduced rank matrix with m columns can be multiplied by any vector of length m. Composite sources that broadcast weakly are generally associated with the space of vectors for which that product is relatively small (e.g., in one embodiment, the product is zero or close to zero). Composite sources that broadcast strongly are generally associated with the space of vectors for which that product is not necessarily small.

Composite sources can extend over more than one region. In one embodiment, this is achieved by using the technique used with Malvar wavelets (also called local cosines) to extend Fourier transforms on disjoint intervals to overlapping orthogonal functions.

Persons of ordinary skill in the art know how near-field results are related to far-field results. A relationship between near-field and far-field can be used in a straightforward way to transform the method described above using far-field data into a method using near-field data. Note that, the "far-field" as used herein is not required to correspond to the traditional $2d^2/\lambda$ far-field approximation. Distances closer than $2d^2/\lambda$ can be used (although closer distances will typically need more composite sources to achieve a desired accuracy). A distance corresponding to the distance to other physical regions is usually far enough, and even shorter distances can be acceptable.

Once composite sources are found, the process advances to a step 204 where composite testers are found. Composite testers are found in a manner analogous to the way that composite sources are found. Recall that composite sources are found using the way in which sources of the interaction matrix "broadcast" to distant locations. Composite testers are found using the way in which the testers of the interaction matrix "receive" from a dense group of directions for a distant disturbance. It is helpful if the received quantity or quantities which are used include relatively all field quantities, except (optionally) those which are very weakly received. For example, when receiving electromagnetic radiation from a distant source, the longitudinal component is approximately zero and can often be neglected. A matrix R describing how these testers receive is formed. A matrix method is used to construct composite testers that receive strongly and testers that receive weakly. The matrix method can be a rank-revealing factorization such as singular value decomposition. A singular value decomposition gives the composite testers as a linear combination of the testers which had been used in the original matrix description.

Figure 4:
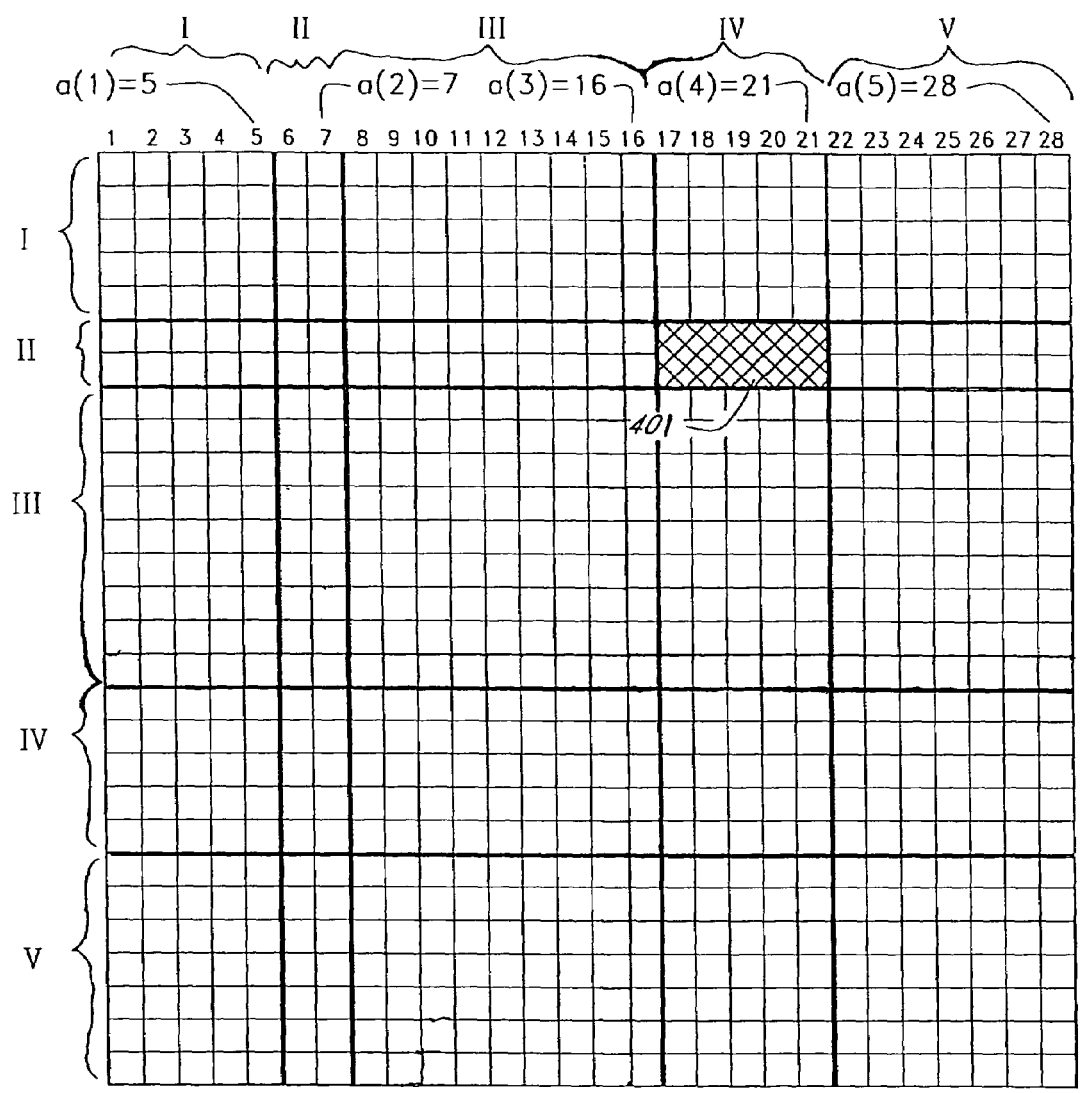
FIG. 4 shows an example of an interaction matrix (before transformation) for a body partitioned into five differently sized regions.

Once composite sources and testers have been found, the process advances to a step 205 or to a step 215 where the interaction matrix is transformed to use composite sources and testers. The steps 205 and 215 are alternatives. FIG. 4 shows an example of an interaction matrix 400 having 28 unknowns (28 sources and 28 testers) grouped into five physical regions (labeled I-V). The shaded block 401 of the matrix 400 represents the interaction for sources in the fourth region (region IV) and testers in the second region (region II). The interaction of a pair of regions describes a block in the interaction matrix 400. The blocks of the transformed matrix can be computed at any time after the composite functions for their source and tester regions are both found. That is, the block 401 can be computed after composite sources for region IV and testers for region II are found.

The step 215 of FIG. 2 shows one method for computing all of the blocks in the matrix 400 by computing the entries for these blocks using the original sources and testers. Then, the process advances to an optional step 216 where these blocks are transformed into a description in terms of the composite sources and composite testers.

One advantage of using composite sources and testers is that many entries in the transformed matrix will be zero. Therefore, rather than transforming into a description using composite modes, the step 205 shows calculation of the transformed block directly using the composite sources and composite testers (without first calculating the block using the original sources and testers). In other words, the composite sources are used as basis functions, and the composite testers are used as weighting functions. Within each block, entries that are known au priori to be zero (or very small) are not calculated.

Further savings in the storage required are possible. After each block has been transformed, only the largest elements are kept. No storage needs to be used for the elements that are approximately zero. Many types of block structures, including irregular blocks and multilevel structures, can also be improved by the use of this method for storing a block sparse matrix. This will usually result in a less regular block structure. As an alternative, it is also possible to store a portion of the interaction data using composite sources and testers and to store one or more other portions of the data using another method.

Figure 5:
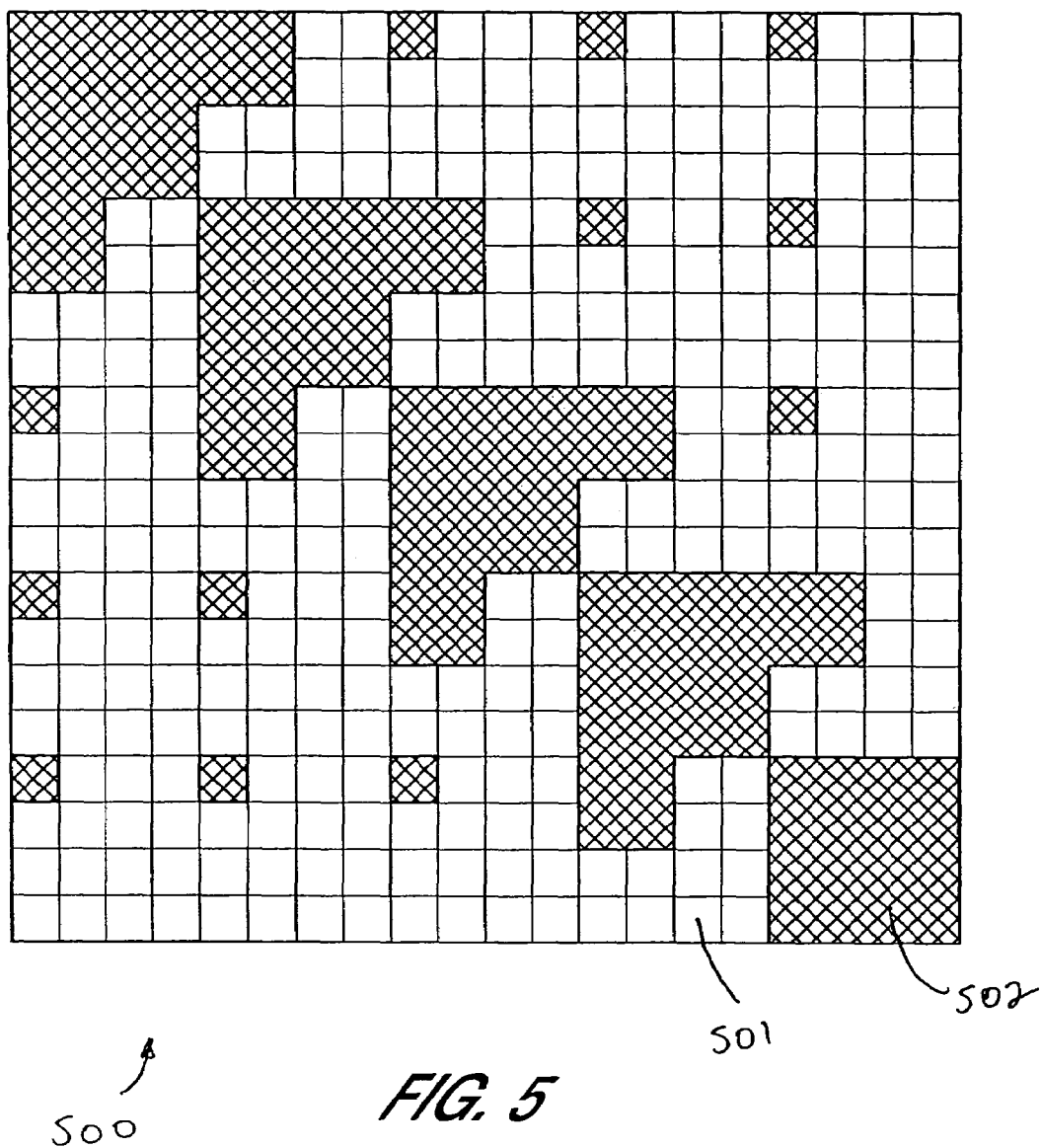
FIG. 5 shows an example of an interaction matrix after transformation (but before reordering) for a body partitioned into five regions of uniform size.

The non-zero elements of the interaction matrix typically occur in patterns. After either the step 205 or the step 216, the process advances to a step 206 where the interaction matrix is reordered to form regular patterns. For a more uniform case, where all of the regions have the same number of sources, the resulting transformed matrix T is shown in FIG. 5. FIG. 5 shows non-zero elements as shaded and zero elements as unshaded. If only a compressed storage scheme is desired, the process can stop here. However, if it is desired to calculate the inverse of this matrix, or something like its LU (lower-upper triangular) factorization, then a reordering can be useful.

Figure 6:
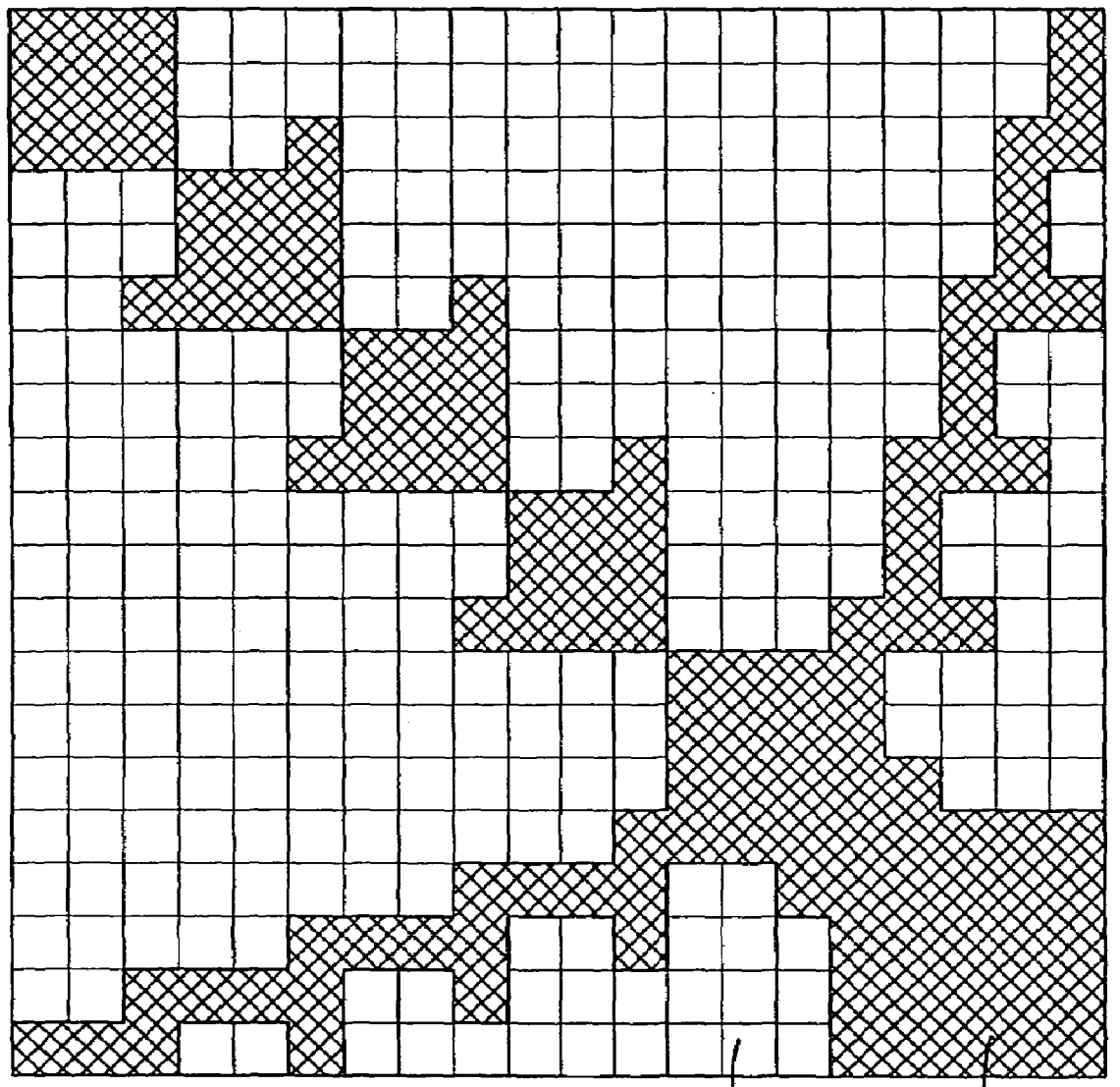
FIG. 6 shows an example of an interaction matrix after transformation and reordering for a body partitioned into five regions of uniform size.

The rows and columns of the interaction matrix can be reordered, to produce a matrix T^ in the form shown in FIG. 6. This permutation moves the composite sources that broadcast strongly to the bottom of the matrix, and it moves the composite testers which receive strongly to the right side of the matrix. The interaction between composite sources and composite testers is such that the size of the matrix elements can be estimated au priori. A matrix element that corresponds to an interaction between a composite source that radiates strongly and a composite tester that receives strongly will be relatively large. A matrix element that corresponds to an interaction between a composite source that radiates strongly and a composite tester that receives weakly will be relatively small. Similarly, a matrix element that corresponds to an interaction between a composite source that radiates weakly and a composite tester that receives strongly will be relatively small. A matrix element that corresponds to an interaction between a composite source that radiates weakly and a composite tester that receives weakly will be very small.

The permuted matrix T^ often will tend to be of a banded form. That is, the non-zero elements down most of the matrix will tend to be in a band near the diagonal. For a matrix of this form, there are many existing sparse-matrix LU factorers and other matrix solvers, that work well. The order shown in FIG. 6 is one example. The LU decomposition of the matrix T^ can be computed very rapidly by standard sparse matrix solvers.

The matrices L and U of the LU decomposition will themselves be sparse. For problems involving certain types of excitations, only a part of the matrices L and U will be needed, and this can result in further savings in the storage required.

After reordering, the process 200 advances to a step 207 where the linear matrix problem is solved. The matrix problem to be solved is written as:

$$T\hat{\,}G=H$$

where the vector H represents the excitation and the vector G is the desired solution for composite sources. The excitation is the physical cause of the sound, temperature, electromagnetic waves, or whatever phenomenon is being computed. If the excitation is very distant (for example, as for a plane wave source), H will have a special form. If the vector H is placed vertically (as a column vector) alongside the matrix of FIG. 6, the bottom few elements of H alongside block 602, will be relatively large, and the remaining elements of H will be approximately equal to zero. The remaining elements of H are approximately zero because the composite testers separate the degrees of freedom according to how strongly they interact with a distant source.

When T^ is factored by LU decomposition, then:

$$T\hat{\,}=LU;$$

$$L\,U\,G=H;$$

and this is solved by the following two-step process;

| Step I: | Find X in | L X = H |
|---|---|---|
| Step II: | Find G in | U G = X |

The matrix L is a lower triangular matrix (meaning elements above its diagonal are zero). It follows immediately from this that if only the bottom few elements of H are non-zero, then only the bottom elements of X are non-zero. As a consequence, only the bottom right portion of L is needed to compute G. The remaining parts of L were used in computing this bottom right portion, but need not be kept throughout the entire process of computing the LU decomposition. This not only results in reduced storage, but also results in a faster computation for Step I above.

If only the far-field scattered by an object needs to be found, then further efficiencies are possible. In that case, it is only necessary to find the bottom elements of G, corresponding to the bottom non-zero elements of H. This can be done using only the bottom right portion of the upper triangular matrix U. This results in efficiencies similar to those obtained for L.

For other types of excitations, similar savings are also possible. For example, for many types of antennas, whether acoustic or electromagnetic, the excitation is localized within one active region, and the rest of the antenna acts as a passive scatterer. In that case, the active region can be arranged to be represented in the matrix of FIG. 6 as far down and as far to the right as possible. This provides efficiencies similar to those for the distant excitation.

A permutation of rows and a permutation of columns of the matrix T of FIG. 5 brings it to the matrix T^ of FIG. 6. These permutations are equivalent to an additional reordering of the unknowns. Thus, a solution or LU decomposition of the matrix T^ of FIG. 6 does not immediately provide a solution to the problem for the original data. Several additional steps are used. These steps involve: including the effects of two permutations of the unknowns; and also including the effect of the transformation from the original sources and testers to using the composite sources and composite testers.

Direct methods (such as LU decomposition) and iterative methods can both be used to solve the matrix equation herein. An iterative solution, with the compressed form of the matrix, can also be used with fewer computer operations than in the prior art. Many iterative methods require the calculation of the product of a matrix and a vector for each iteration. Since the compressed matrix has many zero elements (or elements which may be approximated by zero), this can be done more quickly using the compressed matrix. Thus, each iteration can be performed more quickly, and with less storage, than if the uncompressed matrix were used.

The compressed format of T^ has an additional advantage. In many cases, there is a way to substantially reduce the number of iterations required, resulting in further increases in speed. For example, in the method of conjugate gradients, the number of iterations required to achieve a given accuracy depends on the condition number of the matrix. (The condition number of a matrix is defined as its largest singular value divided by its smallest.) Physical problems have a length scale, and one interpretation of these composite sources and composite testers involves length scales. These composite sources and composite testers can be described in terms of a length scale based on a Fourier transform. This physical fact can be used to improve the condition number of the matrix and therefore also improve the speed of convergence of the iterative method.

A composite source is a function of spatial position, and its Fourier transform is a function of "spatial frequency." Composite sources that broadcast weakly tend to have a Fourier transform that is large when the absolute value of this spatial frequency is large. There is a correlation between how large this spatial frequency is and the smallness of the small singular values of the matrix. This correlation is used in the present invention to provide a method to achieve convergence in fewer iterations.

Two matrices, $P^R$ and $P^L$ are defined as right and left preconditioning matrices to the compressed matrix. Each column of the compressed matrix is associated with a composite source. This composite source can be found using a matrix algebra method, such as a rank-revealing factorization (e.g., singular value decomposition and the like). The rank-revealing factorization method provides some indication of the strength of the interaction between that composite source and other disturbances. For example, using a singular value decomposition, the associated singular value is proportional to this strength. The diagonal matrix $P^R$ is constructed by choosing each diagonal element according to the interaction strength for the corresponding composite source. The diagonal element can be chosen to be the inverse of the square root of that strength. Similarly, the diagonal matrix $P^L$ can be constructed by choosing each diagonal element according to the interaction strength for its associated composite tester. For example, the diagonal element can be chosen to be the inverse of the square root of that strength.

If the compressed matrix is called T, then the preconditioned matrix is $$P = P^L T P^R$$

The matrix P will often have a better (i.e., smaller) condition number than the matrix T. There are many iterative methods that will converge more rapidly when applied to the preconditioned matrix P rather than to T.

One embodiment of the composite source compression technique is used in connection with the computer program NEC2. This program was written at Lawrence Livermore National Laboratory during the 1970s and early 1980s. The NEC2 computer program itself and manuals describing its theory and use are freely available over the Internet. The following development assumes NEC2 is being used to calculate the electromagnetic fields on a body constructed as a wire grid.

NEC2 uses electric currents flowing on a grid of wires to model electromagnetic scattering and antenna problems. In its standard use, NEC2 generates an interaction matrix, herein called the Z matrix. The actual sources used are somewhat complicated. There is at least one source associated with each wire segment. However, there is overlap so that one source represents current flowing on more than one wire segment. NEC2 uses an array CURX to store values of the excitation of each source.

Figure 10:
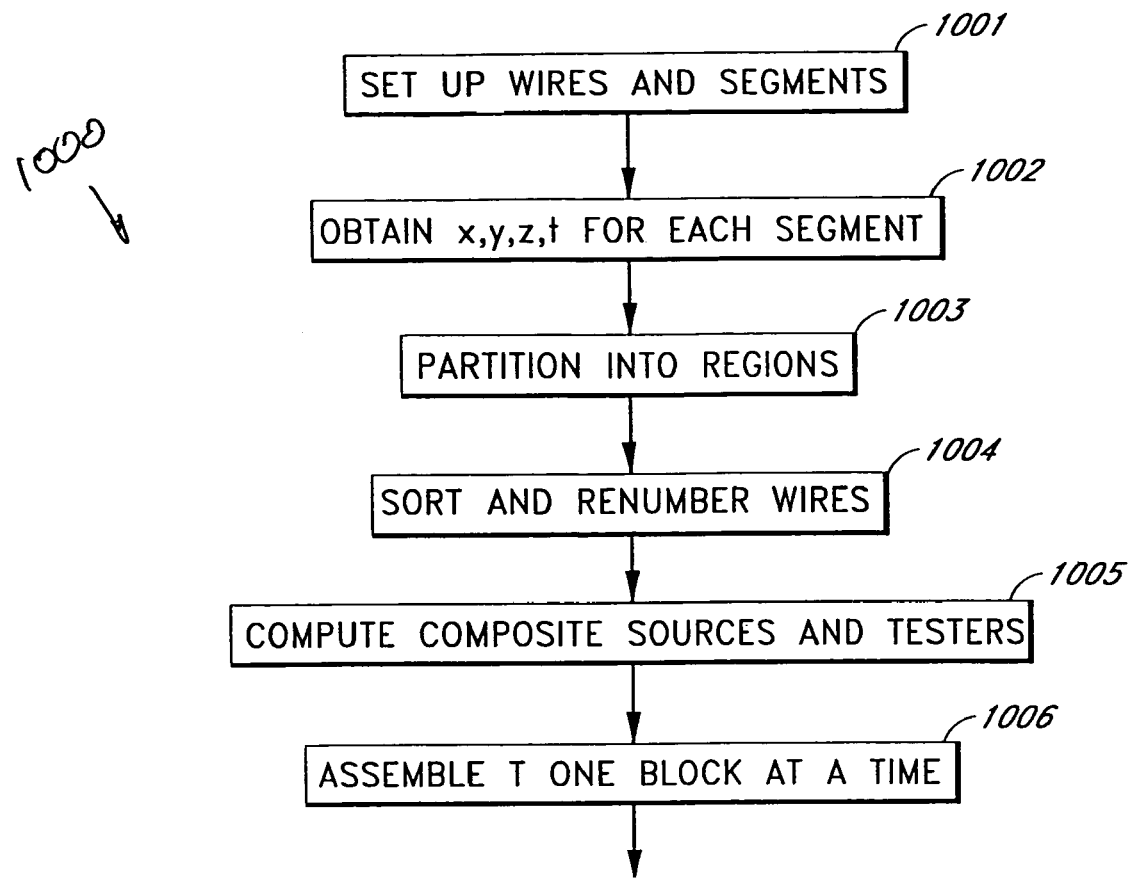
FIG. 10, consisting of FIGS. 10A and 10B, is a flowchart showing the process of generating a compressed (block sparse) impedance matrix in connection with a conventional moment-method computer program.

FIG. 10 is a flowchart 1000 showing the process of using NEC2 with composite sources and composite testers. The flowchart 1000 begins at a step 1001 where the NEC2 user begins, as usual, by setting up information on the grid of wires and wire segments. The process then advances to a step 1002 to obtain from NEC2 the number of wire segments, their locations (x,y,z coordinates), and a unit vector $\hat{t}$ for each segment. The vector $\hat{t}$ is tangent along the wire segment, in the direction of the electric current flow on the wire segment.

Next, in a step 1003, the wire grid is partitioned into numbered regions. A number of reference points are chosen. The reference points are roughly equally spaced over the volume occupied by the wire grid. Each wire segment is closest to one of these reference points, and the segment is considered to be in the region defined by the closest reference point. In one embodiment, the number of such points (and associated regions) is chosen as the integer closest to the square root of N (where N is the total number of segments). This is often an effective choice, although the optimum number of points (and associated regions) depends on many factors, and thus other values can also be used. For a set of N segments, each wire segment has an index, running from 1 to N.

After the step 1003, the process advances to a step 1004 where the wires are sorted by region number. After sorting, the numbering of the wires is different from the numbering used by NEC2. Mapping between the two numbering systems is stored in a permutation table that translates between these different indexes for the wire segments. Using this new numbering of segments, an array "a" is created, such that a(p) is the index of the last wire segment of the $p^{th}$ region (define a(0)=0 for convenience).

After renumbering, the process advances to a step 1005 where composite sources and composite testers for all regions are calculated. Source region p corresponds to unknowns a(p−1)+1 through a(p) in the ordering. Define M as M=a(p)−a(p−1). Choose M directions substantially equally spaced throughout three-dimensional space. In other words, place M roughly equally spaced points on a sphere, and then consider the M directions from the center of the sphere to each point. The order of the directions is unimportant. One convenient method for choosing these points is similar to choosing points on the earth. For example, choose the North and South poles as points. A number of latitudes are used for the rest of the points. For each chosen latitude, choose points equally spaced at a number of longitudes. This is done so that the distance along the earth between points along a latitude is approximately the same as the distance between the latitude lines holding the points. It is desirable that the points are equally spaced. However, even fairly large deviations from equal spacing are tolerable.

Now generate a matrix A of complex numbers with 2M rows and M columns. For m=1 to M and for n=1 to M., compute elements of this matrix two at a time: the element at row m and column n and also the element at row m+M and column n. To compute these two elements, first fill the NEC2 array CURX with zero in every position. Then, set position a(p−1)+n of CURX to unity. A value of unity indicates that only source number a(p−1)+n is excited. This source is associated with the wire segment of that number, even though it extends onto neighboring segments. The matrix Z is defined in terms of these same sources. Then, call the NEC2 subroutine CABC (CURX). The subroutine CABC generates a different representation of the source, but the same representation that the NEC2 subroutine FFLD uses. This representation is automatically stored within NEC2. The $m^{th}$ direction previously chosen can be described in spherical coordinates by the pair of numbers (Theta, Phi). After calculating Theta and Phi, the NEC2 subroutine FFLD (Theta,Phi, ETH,EPH) is called. Theta and Phi are inputs, as are the results from CABC. The outputs from FFLD are the complex numbers ETH and EPH. ETH and EPH are proportional to the strengths of the electric field in the far-field (far away from the source) in the theta and phi directions respectively. ETH is placed in row m and column n, (m,n), of A. EPH is placed at row m+M and column n of A. Alternatively, there are other ways to compute the numbers ETH and EPH produced by FFLD. For example, it will apparent to one of ordinary skill in the art that the subroutine FFLD can be modified to produce an answer more quickly by making use of the special form of the current, since most of the entries in the current are zero.

Next, a singular value decomposition of A is performed, such that:

$$A = U D V^h$$

where U and V are unitary matrices, and D is a diagonal matrix. The matrix U will not be used, so one can save on computer operations by not actually calculating U. The matrix V has M rows and M columns. Since these calculations were performed for the $p^{th}$ region, the square matrix $d_P^R$ is defined by $$d_P^R = V$$

The reason for this choice comes from the fact that $$A V = U D$$

and that each successive columns of the product UD tends to become smaller in magnitude. They become smaller because U is unitary and the singular values on the diagonal of D decrease going down the diagonal.

Figure 7:
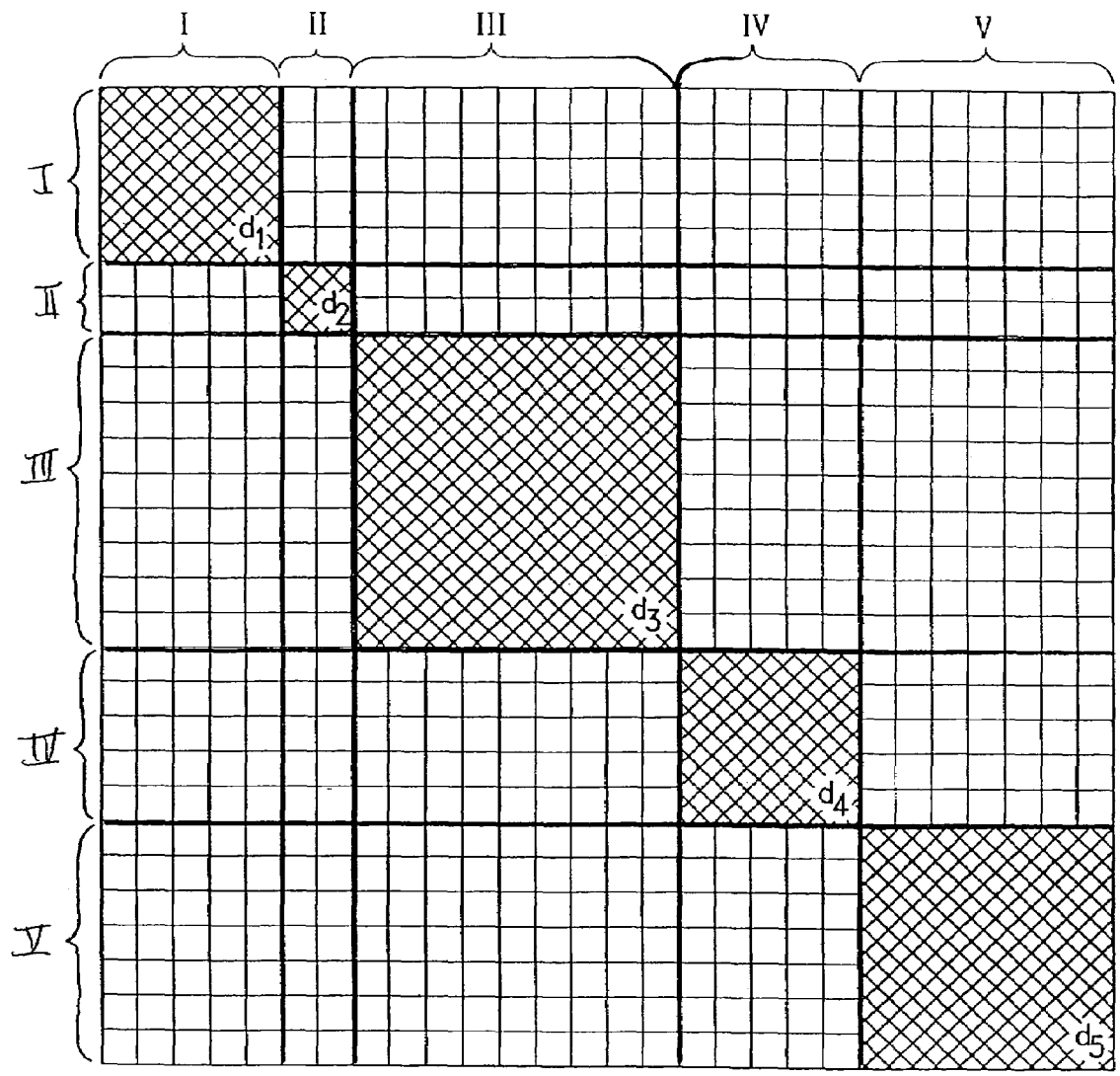
FIG. 7 illustrates the block diagonal matrix $D^R$.

Next, assemble an N by N block diagonal matrix $D^R$. That is, along the diagonal the first block corresponds to p=1. Starting at the bottom right corner of that block, attach the block for p=2, etc., as shown in FIG. 7.

Next a similar procedure is followed to find the block diagonal matrix $D^L$. For each region p, a matrix A is filled as before. However, this time this region is considered as receiving rather than as transmitting. Again A will have 2M rows and M columns, where M=a(p)−a(p−1). Again there are M directions, but now those are considered to be the receiving directions.

To understand what is to be put into A, it is instructive to note how the NEC2 computer program defines the interaction matrix Z. When used with wire grid models, the sources radiate electric and magnetic fields. However, it is the electric field reaching another segment that is used in NEC2. Each matrix element of Z is computed by computing the component of that electric field which is in the direction of the tangent to the wire segment.

For the pair of numbers (m,n), where m=1, . . . , M and n=1, . . . , M, the matrix entries for A at (m,n) and (m+M,n) are calculated as follows. Compute a unit vector $\hat{k}$ in the $m^{th}$ direction. Find the unit vector tangent to segment number n, and call it $\hat{t}$. The position of the center of wire segment number n is found and is designated as the vector X. Then compute the vector $$\vec{f} = (\hat{t} - (\hat{k} \cdot \hat{t})\hat{k}) e^{j2\pi \hat{k} \cdot X/\lambda}$$

where the wavelength is given by λ (NEC2 uses units where λ=1).

Note that the Green's function for this problem has a minus sign in the exponential, and the foregoing expression does not. This is because the direction of $\hat{k}$ is outward, which is opposite to the direction of propagation of the radiation.

For problems in electromagnetics, the physical wavelength λ is greater than zero. If a problem in electrostatics were being solved instead, electrostatics can be considered as the limit when the wavelength becomes arbitrarily large. The complex exponential above can then be replaced by unity. Also, for electrostatics, the relevant field quantity can be longitudinal (meaning f would be parallel to $\hat{k}$).

For this value of m (and associated direction $\hat{k}$), spherical coordinates define two directions called the theta and the phi directions. These directions are both perpendicular to the direction of $\hat{k}$. Compute the components of f in each of these directions, and designate them as fTheta and fPhi. These are complex numbers. Then place fTheta in row m and column n of A and place fPhi in row m+M and column n of A.

The matrix A is a matrix of complex numbers. Take the complex conjugate of A, (A*), and perform a singular value decomposition on it, such that:

$$A^* = U D V^h$$

Now define the left diagonal block for region p, $d_p^L$, as $$d_p^L = V^h$$

The superscript h on V, indicates Hermitian conjugate. The definition of the blocks for the right side did not have this Hermitian conjugate. From these diagonal blocks, assemble an N by N matrix $D^L$ in the same way as $D^R$ was assembled earlier. The motivation for these choices is partly that the matrix $DU^h$ has rows that tend to become smaller. Further, it is expected that the Green's function that was used in creating Z has properties similar to the far-field form used in creating $A^t$. The formula $$V^h A^t = D U^h$$

shows that $V^h A^t$ will also have successive rows that tend to become smaller. The choices described above suggest that successive rows of each block of the compressed matrix will also have that property.

It should be noted that the matrix A, whether used for the right side or for the left side, can be filled in other ways as well. For example, with an appropriate (consecutive in space) ordering of the angles, A can be made as an M by M matrix by using theta polarization (fTheta) values for one angle and phi polarization values (fPhi) for the next. Usually, it is desirable that A does not leave large gaps in angle for any component of the electric field, which is important far from the source or receiver.

In performing the singular value decompositions for the right and left sides, singular values are found each time. FIGS.

Figure 8:
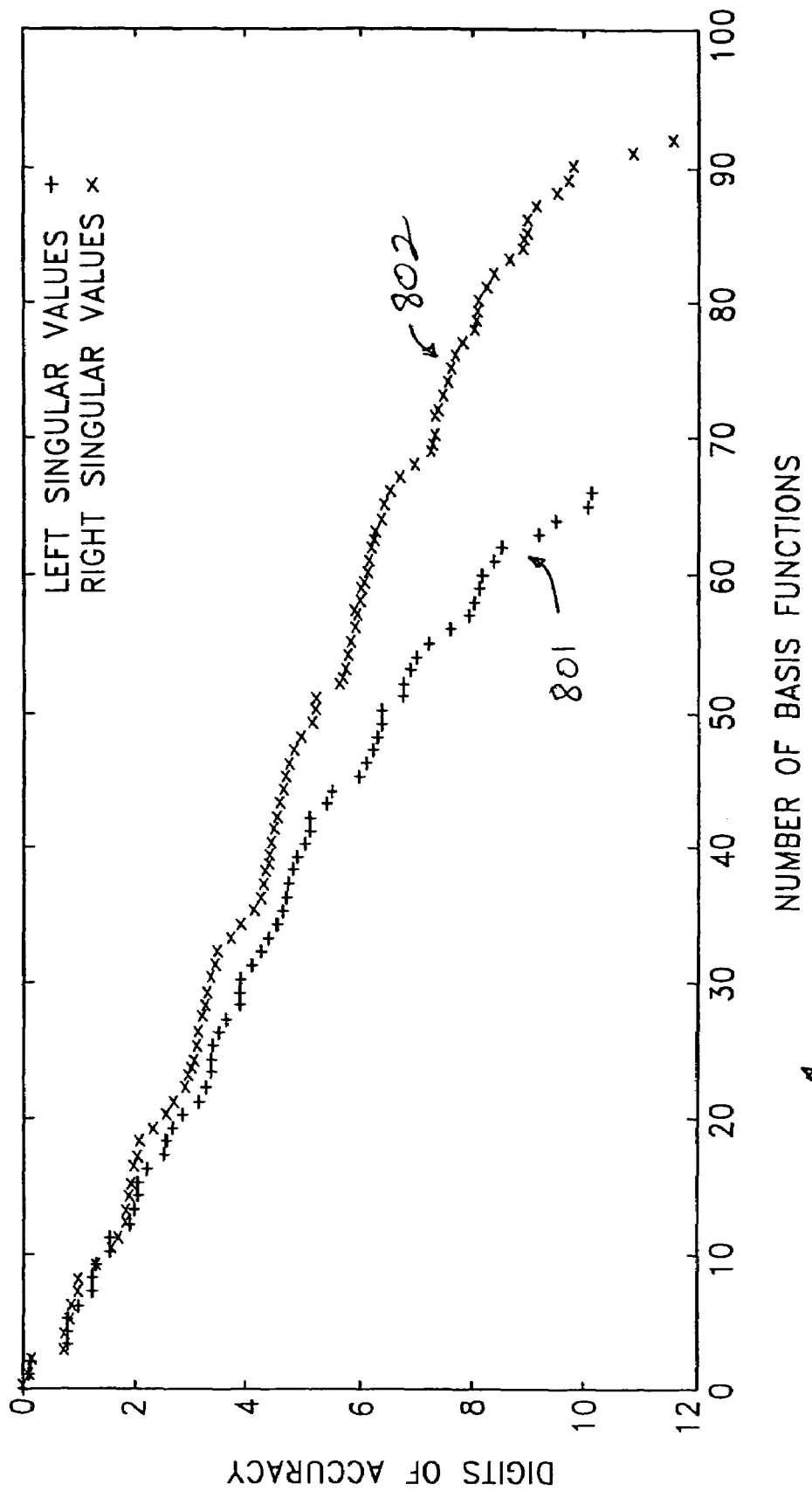
FIG. 8 is a plot showing the digits of accuracy obtained after truncating the basis functions for a block of the entire interaction matrix, with a block size of 67 by 93.
Figure 9:
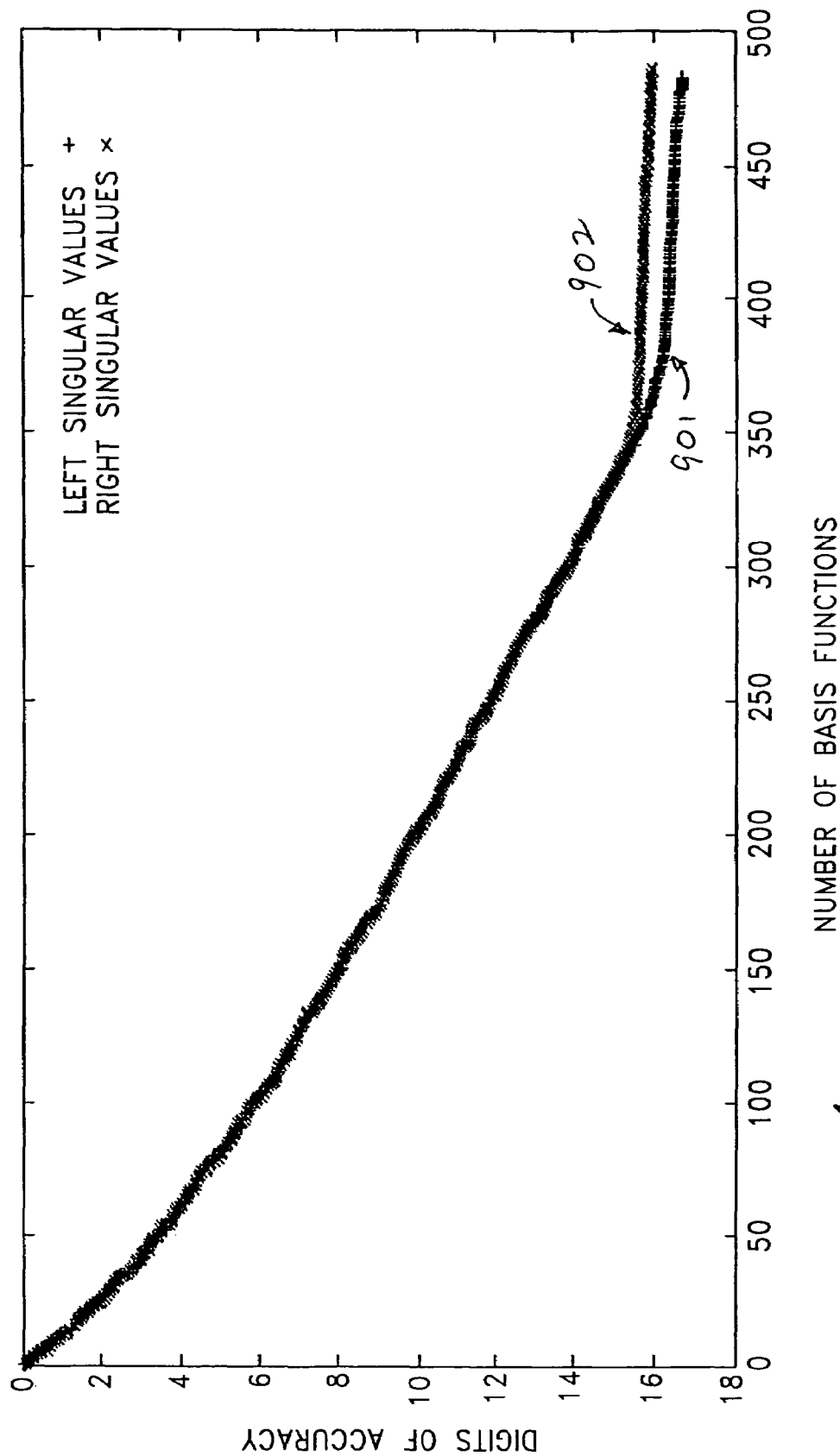
FIG. 9 is a plot showing the digits of accuracy obtained after truncating the basis functions for a block of the entire interaction matrix, with a block size of 483 by 487.

8 and 9 show the singular values found for blocks of size 67 by 93 and 483 by 487, respectively. These calculations were done for a wire grid model with NEC2. The singular values are plotted in terms of how many orders of magnitude they are smaller than the largest singular value, and this is called "Digits of Accuracy" on the plots. FIGS. 8 and 9 show the accuracy that is achieved when truncating to a smaller number of composite sources or composite testers for regions that are relatively far apart. For regions that are closer together, the desired accuracy often requires the information from more composite sources and composite testers to be kept.

After computing composite sources and composite testers, the process advances to a step 1006 where a new matrix T, which uses the composite sources and testers associated with $D^L$ and $D^R$, is computed. The matrix is T given by the equation $$T = D^L Z D^R$$

T can be efficiently generated by using the numbering of the wire segments developed herein (rather than the numbering used in NEC2). The matrix Z is computed by NEC2 and renumbered to use the numbering described herein. Note that a block structure has been overlaid on Z and T. This block structure follows from the choice of regions. FIG. 4 shows one example of a block structure. Block {p,q} of the matrix T, to be called T{p,q}, is the part of T for the rows in region number p and the columns in region number q. The formula for T given above is such that T{p,q} only depends on Z{p,q}. Thus, only one block of Z at a time needs to be stored.

In the step 1006, T is assembled one block at a time. For each block of T, first obtain from NEC2 the corresponding block of Z. The wire segments within a block are numbered consecutively herein (NEC2 numbers them differently). Thus, first renumber Z using the renumber mapping from step 1004, and then perform the calculation:

$$T\{p,q\} = d_p^L Z\{p,q\} d_q^R$$

Many of the numbers in T{p,q} will be relatively small. An appropriate rule based on a desired accuracy is used to choose which ones may be approximated by zero. The remaining non-zero numbers are stored. Storage associated with the zero-valued elements of T{p,q} and of Z{p,q} can be released before the next block is calculated. The top left portion of T{p,q} has matrix elements which will be kept. Anticipating this, the calculation speed can be increased by not calculating either the right portion or the bottom portion of T{p,q}.

The matrix T is a sparse matrix, and it can be stored using an appropriate data structure for a sparse matrix. For a matrix with $N_Z$ non-zero elements, an array $Z_Z(i)$ for i=1,..., $N_Z$, can be used, where $Z_Z(i)$ is the complex value of the $i^{th}$ matrix element. There are two integer valued arrays, $I_Z(i)$ and $J_Z(i)$ for i=1,..., $N_Z$. $I_Z(i)$ gives the row number where the $i^{th}$ matrix element occurs in T and $J_Z(i)$ its column number.

After calculation of T, the process proceeds to a process block 1007 where the rows and columns of the matrix T are reordered to produce a matrix T^. The matrix T is reordered into a matrix T^ so that the top left corner of every block of T^ ends up in the bottom right corner of the whole matrix. The T^ form is more amenable to LU factorization. FIG. 5 shows an example of a matrix T, and FIG. 6 shows an example of a matrix T^ after reordering. One embodiment uses a solver that has its own reordering algorithms thus negating the need for an explicit reordering from T to T^.

After reordering, the process advances to a step 1008 where the matrix T^ is passed to a sparse matrix solver, such as, for example, the computer program "Sparse," from the Electrical Engineering Department of University of California at Berkeley. The program Sparse can be used to factor the matrix T^ into a sparse LU decomposition.

NEC2 solves the equation $$J = Z^{-1} E$$

for various vectors E. In FIG. 10, the solution of the above matrix equation is done in steps 1009-1016 or, alternatively, in steps 1017-1023. The sequence of steps 1009-1016 is used with a matrix equation solver that does not provide reordering. The sequence of steps 1017-1023 is used with a matrix equation solver that does provide reordering.

In the step 1009, the vector E is computed by NEC2. Then, in the step 1010, the elements of E are permutated (using the same permutation as that used in the step 1004) to produce a vector E'. This permutation is called the region permutation. Next, in the step 1011, E' is expressed in terms of composite testers by multiplying E' by $D^L$, giving $D^L E'$. Then, in the step 1012, the same permutation used in the step 1007 is applied to $D^L E'$ to yield $(D^L E')$^. (This permutation is called the solver permutation.) Then, in the step 1013, a matrix equation solver (such as, for example, the solver known as "SPARSE") is used to solve for the vector Y^ from the equation $$T^{\hat{}}(Y^{\hat{}}) = (D^L E')^{\hat{}}$$

Then, in the step 1014, the inverse of the solver permutation is applied to Y^ to yield Y. In the subsequent step 1015, J' is computed from the equation $$J' = D^R Y$$

In the subsequent, and final, step 1016, the inverse of the region permutation is applied to J' to yield the desired answer J.

Alternatively, the embodiment shown in step 1017-1023 is conveniently used when the matrix equation solver provides its own reordering algorithms, thus eliminating the need to reorder from T to T^ (as is done in the step 1007 above). In the step 1017, a reordering matrix solver is used to solve the matrix T. In the subsequent step 1018, the vector E is computed by NEC2. Then, in the step 1019, the elements of E are permutated using the region permutation to produce a vector E'. Then, in the step 1020, $D^L E'$ is computed. The process then proceeds to the step 1021 where the equation $$TY = D^L E'$$

is solved for Y. After Y is computed, the process advances to the step 1022 where J' is calculated from the equation $$J' = D^R Y$$

Finally, in the step 1023, the inverse of the region permutation is applied to J' to yield the desired answer J.

Figure 11:
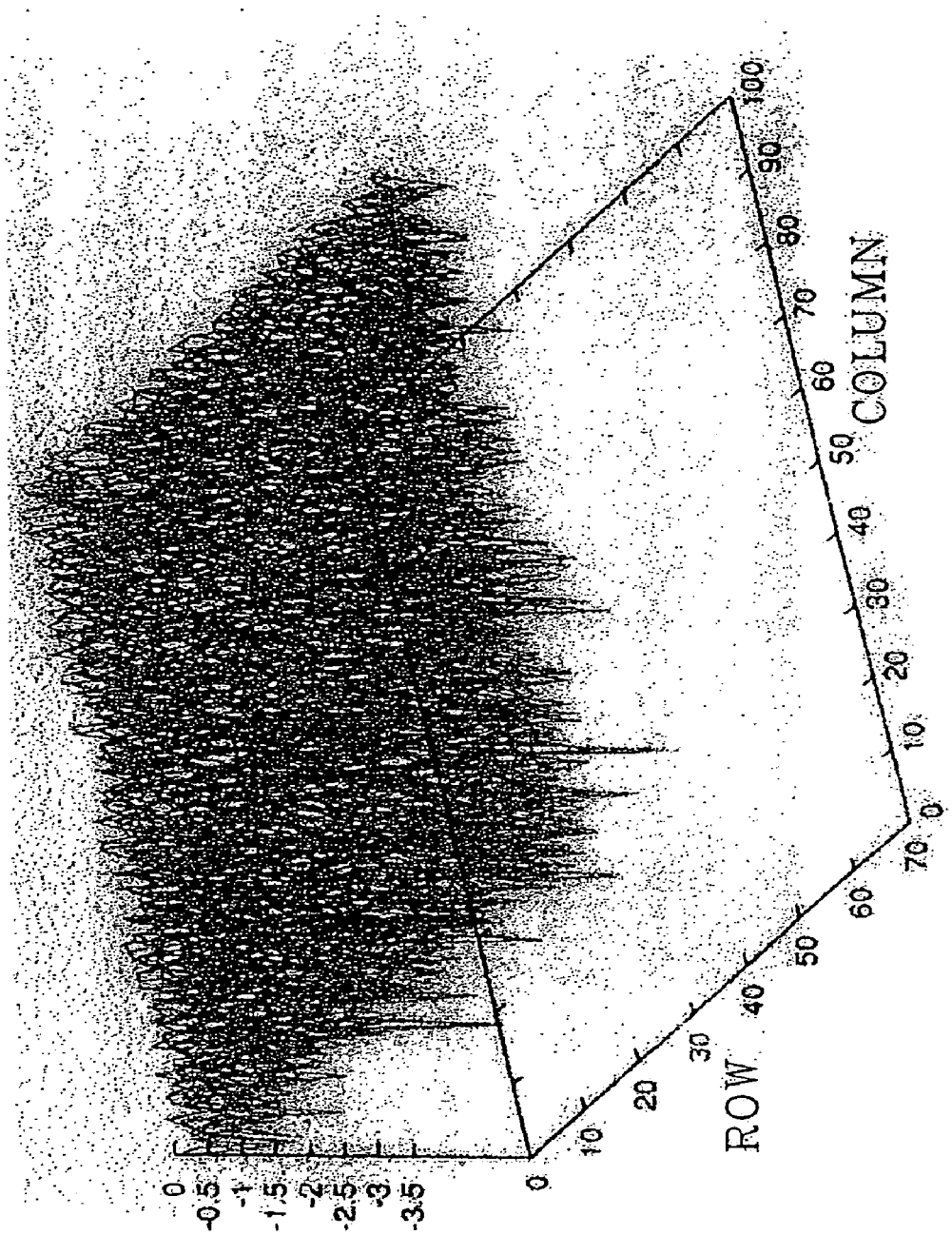
FIG. 11 is a three-dimensional plot showing magnitudes of the entries in a 67 by 93 element block of the interaction matrix (before transformation) for a wire grid model using the method of moments.
Figure 12:
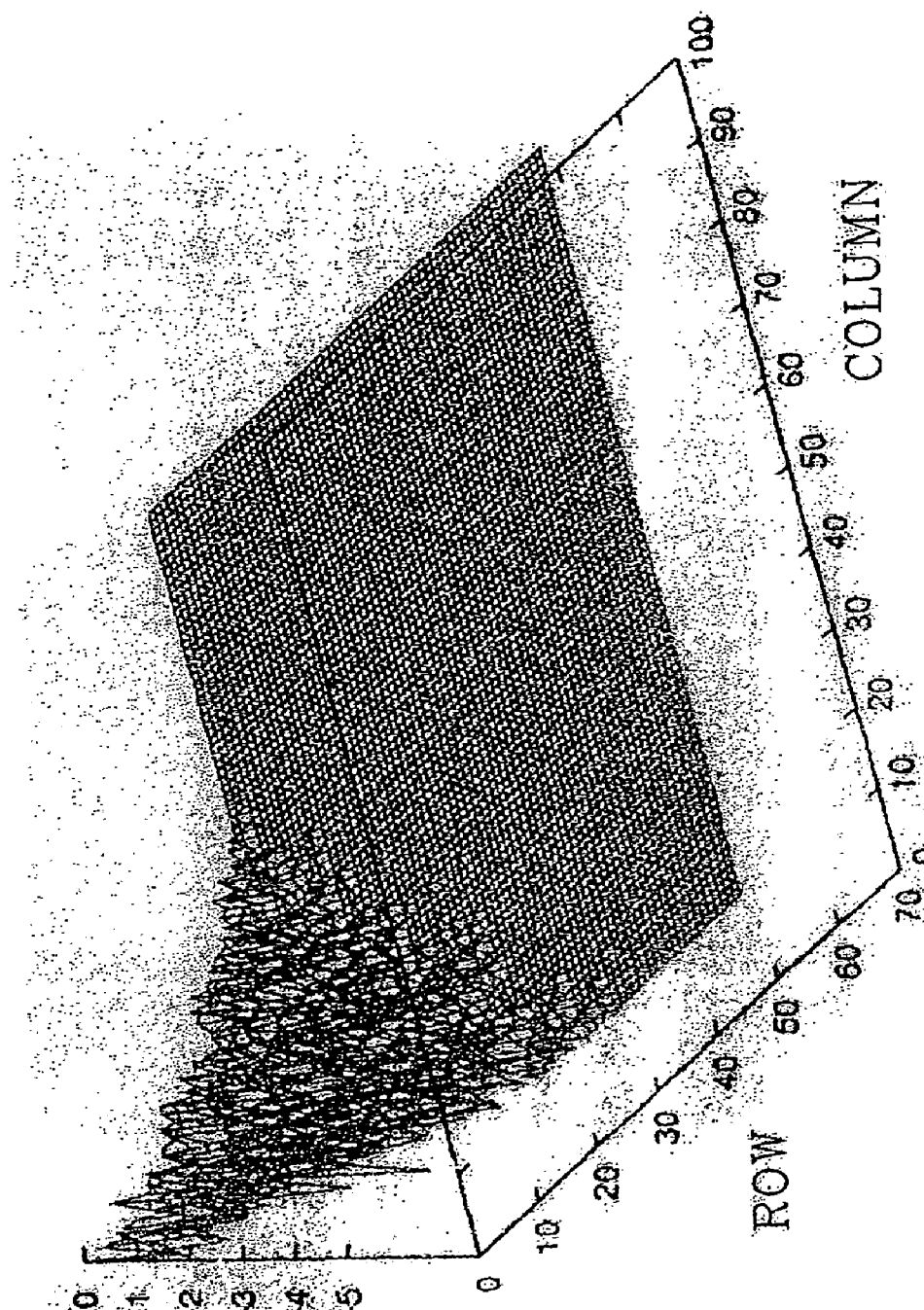
FIG. 12 is a three-dimensional plot showing magnitudes of the entries of the interaction matrix from FIG. 11 after transformation.

Many matrix elements are made small by this method. FIGS. 11 and 12 show before and after results for a problem using a wire grid model in NEC2, with a matrix Z of size 2022 by 2022 and a block of size 67 by 93. FIG. 11 shows the magnitudes of the matrix elements before changing the sources and testers, meaning it shows a 67 by 93 block of the renumbered Z. FIG. 12 shows this same block of T. The matrix T has a regular structure wherein the large elements are in the top left corner. This is a general property of the transformed matrix. For larger blocks, the relative number of small matrix elements is even better.

The algorithms expressed by the flowchart shown in FIG. 2 can be implemented in software and loaded into a computer memory attached to a computer processor to calculate, for example, propagation of energy, pressure, vibration, electric fields, magnetic fields, strong nuclear forces, weak nuclear forces, etc. Similarly, the algorithms expressed by the flowchart shown in FIG. 10 can be implemented in software and loaded into a computer memory attached to a computer processor to calculate, for example, electromagnetic radiation by an antenna, electromagnetic scattering, antenna properties, etc.

Although the foregoing has been a description and illustration of specific embodiments of the invention, various modifications and changes can be made thereto by persons skilled in the art without departing from the scope and spirit of the invention. For example, in addition to electromagnetic fields, the techniques described above can also be used to compress interaction data for physical disturbances involving a heat flux, an electric field, a magnetic field, a vector potential, a pressure field, a sound wave, a particle flux, a weak nuclear force, a strong nuclear force, a gravity force, etc. The techniques described above can also be used for lattice gauge calculations, economic forecasting, state space reconstruction, and image processing (e.g., image formation for synthetic aperture radar, medical, or sonar images). Accordingly, the invention is limited only by the claims that follow.

What is claimed is:

1. A method of calculating a distribution of electric charge or an electric current due to an electric field, comprising:
    using software loaded into a computer memory attached to a computer processor and storing compressed data in said computer memory, partitioning a first set of basis functions into groups, each group corresponding to a region, each basis function corresponding to one unknown in a system of linear equations, each of said basis functions corresponding to an original source, wherein said system of linear equations models said distribution of electric charge or electric current due to said electric field;
    selecting a plurality of spherical angles;
    calculating a far-field disturbance produced by each of said basis functions in a first group for each of said spherical angles to produce a matrix of transmitted disturbances wherein a plurality of said basis functions in said first group of basis functions describes electric fields produced by electric charge;
    on said computer processor, using a first rank reduction to reduce a rank of said matrix of transmitted disturbances to yield a second set of basis functions, said second set of basis functions corresponding to composite sources, each of said composite sources comprising a linear combination of a plurality of basis functions of said first set of basis functions;
    partitioning a first set of weighting functions into groups, each group corresponding to a region, each weighting function corresponding to a condition, each of said weighting functions corresponding to an original tester;
    calculating a far-field disturbance received by each of said testers in a first group of testers for each of said spherical angles to produce a matrix of received disturbances;
    on said computer processor, using a second rank reduction to reduce a rank of said matrix of received disturbances to yield a second set of weighting functions, said second set of weighting functions corresponding to composite testers, each of said composite testers comprising a linear combination of a plurality of said original testers;
    transforming said system of linear equations to use said composite sources and said composite testers to produce a second system of equations wherein at least a portion of said second system of equations is compressed relative to said system of linear equations and wherein for at least a first portion of said second system of equations using said composite sources and said composite testers, at least a portion of said matrix of transmitted disturbances is different from said matrix of received disturbances and wherein said compression enables relatively more efficient use of said second system of equations; and
    using said second system of equations calculating and storing said distribution of electric charge or electric current due to said electric field.

2. The method of claim 1, wherein said transforming said system of linear equations produces a substantially sparse system of linear equations.

3. The method of claim 1, wherein said matrix of received disturbances comprises a moment-method matrix.

4. The method of claim 1, wherein said matrix of transmitted disturbances comprises a moment-method matrix.

5. A method of data compression, comprising:
    using a computer program in a computer-readable medium attached to a computer processor, partitioning a first set of basis functions into groups, each group corresponding to a region, each basis function corresponding to an unknown in a system of equations, each of said basis functions corresponding to an original source, wherein said system of equations models at least one of an electric field, a magnetic field, a pressure, and a particle flux that is produced by at least one of a distribution of electric charge, an electric current, an exciting pressure, and an exciting particle flux;
    selecting a first plurality of angular directions;
    using said computer processor, calculating a disturbance produced by each of said basis functions in a first group for each of said angular directions to produce a matrix of disturbances;
    using said matrix of disturbances to compute a second set of basis functions, said second set of basis functions corresponding to composite sources, wherein at least one of said composite sources is configured to produce a relatively weak disturbance to a portion of space relative to said at least one composite source;
    partitioning a first set of weighting functions into groups, each group corresponding one of said regions, each weighting function corresponding to a condition, each of said weighting functions corresponding to an original tester;
    using said computer processor, calculating a disturbance received by each of said testers in a second plurality of angular directions to produce a matrix of received disturbances;
    using said matrix of received disturbances to compute a second set of weighting functions, said second set of weighting functions corresponding to composite testers, wherein at least one of said composite testers is configured to weakly receive disturbances from a portion of space relative to said at least one composite tester;
    transforming at least a first portion of said system of equations into a transformed system of equations to use one or more of said composite sources and one or more of said composite testers wherein at least a second portion of said transformed system of equations is compressed relative to said system of equations;
    storing said second portion in a computer readable medium attached to said processor;
    wherein for an element of said second portion of said transformed system of equations said matrix of disturbances is, at least in part, different from said matrix of received disturbances; and
    using said second portion of said transformed system of equations to compute and store said at least one of an electric field, a magnetic field, a pressure, and a particle flux that is produced by said at least one of a distribution of electric charge, an electric current, an exciting pressure, and an exciting particle flux.

6. The method of claim 5, wherein said matrix of disturbances is a moment method matrix.

7. The method of claim 5, wherein said step of using said matrix of disturbances to compute a second set of basis functions comprises reducing a rank of said matrix of disturbances.

8. The method of claim 5, wherein said step of using said matrix of received disturbances to compute a second set of weighting functions comprises reducing a rank of said matrix of received disturbances.

9. The method of claim 5, wherein said first plurality of angular directions is substantially the same as said second plurality of angular directions.

10. The method of claim 5, wherein said portion of space relative to said at least one composite source is a far-field region.

11. The method of claim 5, wherein said portion of space relative to said at least one composite tester is a far-field region.

12. The method of claim 5, wherein said matrix of received disturbances comprises a moment-method matrix.

13. The method of claim 5, wherein said transforming at least a first portion of said system of equations to use one or more of said composite sources and one or more of said composite testers comprises transforming substantially all of said system of equations to use one or more of said composite sources and one or more of said composite testers.

14. The method of claim 13, wherein said transforming substantially all of said system of equations produces substantial sparseness.

15. The method of claim 5, wherein said relatively weak disturbance to a portion of space relative to said at least one composite source comprises a portion of space at distances relatively shorter than a distance to other physical regions.

16. The method of claim 15, wherein said portion of space at distances relatively shorter than a distance to other physical regions comprises a relatively non-intertwining portion of space.

17. The method of claim 5, wherein said relatively weak disturbance to a portion of space relative to said at least one composite source comprises a portion of space comprising substantially all angular directions in said first plurality of angular directions.

18. The method of claim 17, wherein said portion of space comprising substantially all angular directions in said first plurality of angular directions comprises a relatively non-intertwining portion of space.

19. A method of data compression, comprising:
using software loaded into a computer-readable memory attached to a computer processor, storing at least a portion of a first system of equations in said computer-readable memory, said first system of equations modeling at least one of an electric field, a magnetic field, a pressure, and a particle flux produced by at least one of a distribution of electric charge, an electric current, an exciting pressure, and an exciting particle flux;
calculating one or more composite sources as a linear combination of more than one basis functions, wherein at least one of said composite sources is configured to produce a relatively weak disturbance in a portion of space related to said at least one composite source;
using said computer processor, calculating one or more composite testers as a linear combination of more than one weighting functions, wherein at least one of said composite testers is configured to be relatively weakly affected by disturbances propagating from a portion of space related to said at least one composite tester;
using said computer processor, transforming at least a portion of said first system of equations based on said basis functions and said weighting functions into a second system of equations based on said composite sources and said composite testers, wherein for an element of said second system of equations one of said one or more composite sources and one of said one or more composite testers are computed using at least partially different data, and wherein said second system of equations is compressed relative to said first system of equations; and
using said second system of equations to compute and store said at least one of an electric field, a magnetic field, a pressure, and a particle flux, resulting, at least in part, from at least one of said a distribution of electric charge, an electric current, an exciting pressure, and an exciting particle flux.

20. The method of claim 19, wherein said composite sources comprise electric currents.

21. The method of claim 19, wherein said composite sources comprise acoustic sources.

22. The method of claim 19, wherein said composite sources comprise electromagnetic sources.

23. The method of claim 19, wherein said composite sources comprise thermal sources.

24. The method of claim 19, wherein each of said composite sources corresponds to a region.

25. The method of claim 19, wherein said second system of equations is described by a sparse block diagonal matrix.

26. The method of claim 25, further comprising the step of reordering said sparse block diagonal matrix to shift relatively larger entries in said matrix towards a desired corner of said matrix.

27. The method of claim 19, wherein said transforming at least a portion of said first system of equations comprises transforming substantially all of said first system of equations based on said basis functions and said weighting functions into a second system of equations based on said composite sources and said composite testers.

28. The method of claim 27, wherein said second system of equations is substantially sparse.

29. The method of claim 19 wherein said at least a portion of said first system of equations comprises an interaction between at least one of said basis functions is relatively close to and at least one of said weighting functions.

30. The method of claim 29 wherein either said one or more composite sources is calculated using a matrix of transmitted disturbances or said one or more composite testers is calculated using a matrix of received disturbances.

31. The method of claim 19 wherein either said one or more composite sources is calculated using a matrix of transmitted disturbances or said one or more composite testers is calculated using a matrix of received disturbances.

32. A method of data compression, comprising:
using a computer program in a computer-readable memory attached to a computer processor, partitioning a first set of basis functions into groups, each group corresponding to a region, each basis function corresponding to one unknown in a system of linear equations, said system of linear equations modeling at least one of an electric field, a magnetic field, a pressure, and a particle flux that is produced by at least one of a distribution of electric charge, an electric current, an exciting pressure, and an exciting particle flux;

selecting a plurality of spherical angles;
calculating a far-field disturbance produced by each of said basis functions in a first group for each of said spherical angles to produce a matrix of transmitted disturbances;
using said computer processor reducing a rank of said matrix of transmitted disturbances to yield a second set of basis functions, said second set of basis functions corresponding to composite sources, each of said composite sources comprising a linear combination of a plurality of basis functions of said first set of basis functions;
identifying weighting functions, each weighting function corresponding to a condition, each of said weighting functions corresponding to a tester; and
using said computer processor transforming said system of linear equations to use one or more of said composite sources and one or more of said testers to produce a second system of equations wherein at least a portion of said second system of equations is compressed relative to said system of linear equations and wherein at least a first portion of said second system of equations uses said composite sources and said testers;
storing at least a portion of said second system of equations on said computer readable memor; and
using said transformed system of equations to compute and store said at least one of an electric field, a magnetic field, a pressure, and a particle flux that is produced by said at least one of a distribution of electric charge, an electric current, an exciting pressure, and an exciting particle flux.

* * * * *